(12) United States Patent
Omura et al.

(10) Patent No.: US 8,193,045 B2
(45) Date of Patent: Jun. 5, 2012

(54) MANUFACTURING METHOD OF THIN FILM TRANSISTOR USING OXIDE SEMICONDUCTOR

(75) Inventors: Hideyuki Omura, Tokyo (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 360 days.

(21) Appl. No.: 12/597,989

(22) PCT Filed: May 28, 2008

(86) PCT No.: PCT/JP2008/060246
§ 371 (c)(1),
(2), (4) Date: Oct. 28, 2009

(87) PCT Pub. No.: WO2008/149873
PCT Pub. Date: Dec. 11, 2008

(65) Prior Publication Data
US 2010/0140612 A1    Jun. 10, 2010

(30) Foreign Application Priority Data
May 31, 2007   (JP) ................................ 2007-145186

(51) Int. Cl.
*H03K 19/094*   (2006.01)
*H03K 19/0948*  (2006.01)

(52) U.S. Cl. ........ 438/151; 438/149; 438/197; 438/282; 438/585; 257/83; 257/288; 257/E51.005; 257/E51.006; 257/E33.001

(58) Field of Classification Search .............. 438/22, 438/142, 149, 151, 154, 156, 158, 159, 161, 438/164, 167, 173, 175, 186, 192, 197, 212, 438/268, 282, 478–479, 482, 483, 585, 590–593; 257/79, 83, 204, 213, 288, 291, 327–328, 257/368, E51.005–E51.006, E33.001, E33.013, 257/E29.151, E29.255, E27.1, E29.117, E27.148, 257/E29.04–E29.05, E29.061, E29.127
See application file for complete search history.

(56) References Cited

U.S. PATENT DOCUMENTS 5,648,662 A * 7/1997 Zhang et al. .................... 257/59
(Continued)

FOREIGN PATENT DOCUMENTS

JP   2007-073558   3/2007
(Continued)

OTHER PUBLICATIONS

H. Yabuta et al., "High-mobility thin-film transistor with amorphous InGaZnO$_4$ channel fabricated by room temperature rf-magnetron sputtering," Applied Physics Letters, vol. 89, pp. 112123-1 thru 112123-3, 2006.

(Continued)

*Primary Examiner* — Laura M Menz
*Assistant Examiner* — Maliheh Malek
(74) *Attorney, Agent, or Firm* — Fitzpatrick, Cella, Harper & Scinto

(57) ABSTRACT

A manufacturing method of a thin film transistor having at least a gate electrode, a gate insulation film, an oxide semiconductor layer, a first insulation film, a source electrode, a drain electrode, and a second insulation film on a substrate, including: forming the gate electrode on the substrate; forming the gate insulation film on the gate electrode; forming a semiconductor layer including amorphous oxide on the gate insulation film; patterning the gate insulation film; patterning the oxide semiconductor layer; reducing the oxide semiconductor layer in resistance by forming the first insulation film on the oxide semiconductor layer in the atmosphere not including an oxidized gas; patterning the first insulation film and forming a contact hole between the source electrode and the drain electrode and the oxide semiconductor layer; forming a source electrode layer and a drain electrode layer in the oxide semiconductor layer through the contact hole; forming the source electrode and the drain electrode through the contact hole and allowing the first insulation film to be exposed; patterning the exposed first insulation film and allowing a channel region of the oxide semiconductor layer to be exposed; and increasing the channel region in resistance by forming the second insulation film on the surface including the channel region of the oxide semiconductor layer in the atmosphere including an oxidized gas.

8 Claims, 12 Drawing Sheets

U.S. PATENT DOCUMENTS

| | | | |
|---|---|---|---|
| 6,620,719 B1* | 9/2003 | Andry et al. | 438/597 |
| 6,838,308 B2* | 1/2005 | Haga | 438/104 |
| 7,049,190 B2 | 5/2006 | Takeda et al. | 438/216 |
| 7,385,224 B2* | 6/2008 | Ishii et al. | 257/72 |
| 7,470,950 B2* | 12/2008 | Hong et al. | 257/326 |
| 7,476,936 B2* | 1/2009 | Kokura et al. | 257/347 |
| 7,563,656 B2* | 7/2009 | Choung et al. | 438/149 |
| 7,585,698 B2* | 9/2009 | Ishii | 438/104 |
| 7,960,289 B2* | 6/2011 | Chang | 438/745 |
| 2003/0047785 A1* | 3/2003 | Kawasaki et al. | 257/350 |
| 2005/0199879 A1* | 9/2005 | Hoffman et al. | 257/72 |
| 2005/0199880 A1 | 9/2005 | Hoffman et al. | 257/72 |
| 2005/0282316 A1* | 12/2005 | Young et al. | 438/149 |
| 2005/0282317 A1* | 12/2005 | Ikeda | 438/149 |
| 2006/0043447 A1* | 3/2006 | Ishii et al. | 257/295 |
| 2006/0054888 A1 | 3/2006 | Ito et al. | 257/43 |
| 2006/0108636 A1 | 5/2006 | Sano et al. | 257/347 |
| 2006/0172470 A1* | 8/2006 | Hara et al. | 438/149 |
| 2006/0199316 A1* | 9/2006 | Kuo | 438/151 |
| 2006/0263955 A1* | 11/2006 | Yamazaki et al. | 438/151 |
| 2007/0040173 A1* | 2/2007 | Kugimiya et al. | 257/59 |
| 2007/0065997 A1* | 3/2007 | Lin | 438/158 |
| 2007/0069209 A1 | 3/2007 | Jeong et al. | 257/57 |
| 2007/0207574 A1* | 9/2007 | Wang et al. | 438/149 |
| 2007/0241327 A1* | 10/2007 | Kim et al. | 257/43 |
| 2008/0020550 A1* | 1/2008 | Ye et al. | 438/478 |
| 2009/0186437 A1* | 7/2009 | Akimoto | 438/30 |
| 2009/0269881 A1* | 10/2009 | Furuta et al. | 438/104 |
| 2010/0035378 A1* | 2/2010 | Chang | 438/104 |
| 2010/0044709 A1* | 2/2010 | Nakayama et al. | 257/59 |
| 2010/0065837 A1* | 3/2010 | Omura et al. | 257/43 |
| 2010/0075472 A1* | 3/2010 | Choi et al. | 438/155 |
| 2010/0120197 A1* | 5/2010 | Levy et al. | 438/104 |
| 2010/0244022 A1* | 9/2010 | Takahashi et al. | 257/43 |
| 2010/0264422 A1* | 10/2010 | Hayashi et al. | 257/72 |
| 2010/0283055 A1* | 11/2010 | Inoue et al. | 257/59 |
| 2011/0024741 A1* | 2/2011 | Abe et al. | 257/43 |
| 2011/0050733 A1* | 3/2011 | Yano et al. | 345/690 |
| 2011/0117697 A1* | 5/2011 | Akimoto et al. | 438/104 |
| 2011/0163311 A1* | 7/2011 | Akimoto et al. | 257/43 |
| 2011/0193082 A1* | 8/2011 | Iwasaki | 257/43 |

FOREIGN PATENT DOCUMENTS

| | | |
|---|---|---|
| JP | 2007-073559 | 3/2007 |
| JP | 2007-073563 | 3/2007 |
| TW | 2006-05722 A | 2/2006 |
| TW | 2006-13868 A | 5/2006 |

OTHER PUBLICATIONS

International Preliminary Report on Patentability in PCT/JP2008/060246 dated Dec. 10, 2009—7 pages.

Office Action dated Dec. 26, 2011 issued in Taiwan Application No. 097119915 (6 pages).

* cited by examiner

FIG. 17A
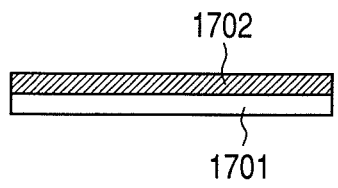
FIG. 17B
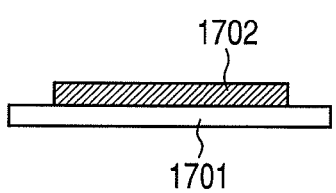
FIG. 17C
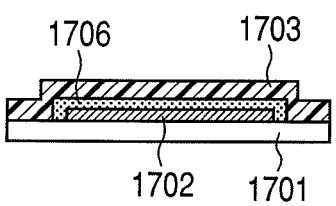
FIG. 17D
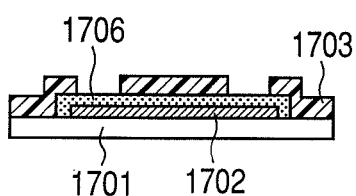
FIG. 17E
FIG. 17F
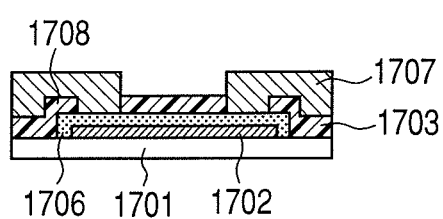
FIG. 17G
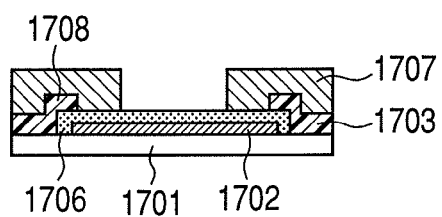
FIG. 17H
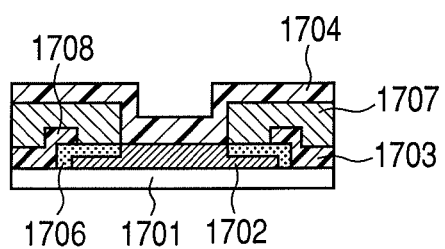
FIG. 17I
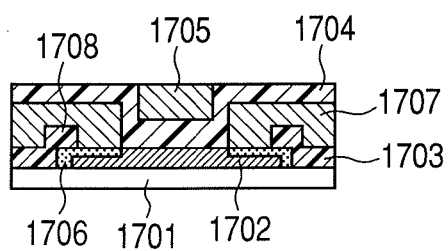
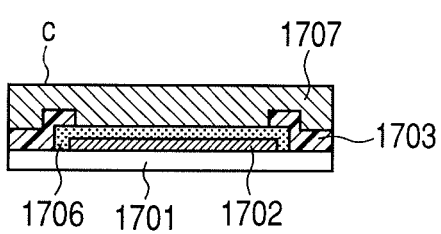

MANUFACTURING METHOD OF THIN FILM TRANSISTOR USING OXIDE SEMICONDUCTOR

TECHNICAL FIELD

The present invention relates to a manufacturing method of a thin transistor film using an oxide semiconductor.

BACKGROUND ART

In recent years, in a thin film transistor used as a switching element of a display device such as an active matrix type liquid crystal display element or an organic electroluminescent element, the next generation thin film transistor has been actively developed. That is, the development of a thin film transistor using a transparent conductive oxide poly-crystal thin film mainly made of ZnO as a channel layer. This thin film is highly-mobile than amorphous silicon, and can be deposited at low temperature, and can form a flexible transparent thin film transistor on a substrate such as plastic plate and film. Further, since it is transparent for visible light, a shielding layer and the like are not required.

An example of the manufacturing method of the thin film transistor mainly made of ZnO as described above will be described below. A semiconductor layer including an intrinsic zinc oxide is formed on a gate insulation film, and a protection film having the same shape as an end face of the semiconductor layer is formed, and on the upper surface thereof, an upper layer insulation film is formed, and after that, a contact hole is formed. The semiconductor layer upper surface exposed through this contact hole is formed with an ohmic contact layer by an n-type ZnO or a region in which a semiconductor layer and an electrode are in contact with each other is subjected to low-resistance processing, and after that, on that upper face, a source electrode and a drain electrode are formed (US Patent Application Publication No. 2006/043447A1). However, in the above described thin film transistor, it is difficult to form a thin film which is flat and high in uniformity in the poly-crystal thin film. Consequently, a fluctuation of the quality numerously arises.

Hence, an attempt is made to develop a thin film transistor which uses a transparent amorphous oxide semiconductor film for the channel layer. In the amorphous thin film, it is possible to form a thin film flat and high in uniformity. In "Applied Physics Letters, 89, 112123, (2006)", it is disclosed that a transparent amorphous oxide semiconductor film (a-IGZO) is deposited at the room temperature by a magnetron sputtering method as a channel layer of the thin film transistor, thereby to obtain a semiconductor layer good in flatness and uniformity. This thin film transistor has electric field-effect mobility of 12 $cm^2V^{-1}s^{-1}$, and is a good thin film transistor.

DISCLOSURE OF THE INVENTION

However, in the above descried conventional technology, as a configuration of the thin film transistor, the ohmic contact layer and the like are not provided, and depending on the selection of electrode materials, there is a problem that comes from non-ohmic contact nature with the oxide semiconductor and the source electrode as well as the drain electrode.

The present invention has been made in view of the above described problem. That is, in the thin film transistor using the amorphous oxide semiconductor, an object of the invention is to provide a thin film transistor having transistor characteristics good in ohmic contact nature with the source electrode and the drain electrode as well as the amorphous oxide semiconductor layer.

The present inventor and others have strenuously conducted research and development on the thin film transistor using the transparent oxide semiconductor, and as a result, the following knowledge was obtained, which is capable of solving the above described problem by the following configuration. That is, a first insulation film covering the oxide semiconductor layer is taken as an oxide insulator, and is formed on the oxide semiconductor layer in the atmosphere not including an oxidized gas. When the insulation film is formed on the oxide semiconductor layer in the atmosphere not including the oxidized gas, the oxide semiconductor layer receives damages and is reduced in resistance to such an extent that the thin film transistor is unable to be turned off. Hence, the first insulation film is removed by patterning, and a channel region of the oxide semiconductor layer is exposed, and after that, a second insulation film covering the channel region is formed in the atmosphere including the oxidized gas. As a result, the channel region which was reduced in resistance is increased in resistance to such an extent of being capable of turning off the thin film transistor. Consequently, the oxide semiconductor layer can be formed with a channel region highly increased in resistance and a region reduced in resistance. With the region reduced in resistance of the oxide semiconductor layer taken as a contact region with an electrode, a source electrode or a drain electrode is formed, so that a thin film transistor good in ohmic contact can be manufactured. The formation of the source electrode and the drain electrode, as described below, may be before or after the second insulation film is formed on the oxide semiconductor. Further, it is possible to manufacture a thin film transistor of any type of a bottom gate type and a top gate type.

Specifically, the present invention is as follows.

The present invention is a manufacturing method of a thin film transistor having at least a gate electrode, a gate insulation film, an oxide semiconductor layer, a first insulation film, a source electrode, a drain electrode, and a second insulation film on a substrate, and includes forming the gate electrode; forming the gate insulation film on the gate electrode; forming the semiconductor layer including amorphous oxide on the gate insulation film; patterning the gate insulation film; patterning the oxide semiconductor layer; reducing the oxide semiconductor layer in resistance by forming the first insulation film on the oxide semiconductor layer in the atmosphere not including oxidized gas; patterning the first insulation film and forming contact holes between the source electrode and the drain electrode and the oxide semiconductor layer; forming the source electrode layer and the drain electrode layer on the oxide semiconductor layer through the contact holes; forming the source electrode and the drain electrode by the patterning and allowing the first insulation film to be exposed; patterning the exposed first insulation film and allowing the channel region of the oxide semiconductor layer to be exposed; and increasing the channel region in resistance by forming the second insulation film on the surface including the channel region of the oxide semiconductor layer in the atmosphere including the oxidized gas on the substrate.

Further, the present invention is a manufacturing method of a thin film transistor having at least a gate electrode, a gate insulation film, an oxide semiconductor layer, a first insulation film, a source electrode, a drain electrode, and a second insulation film on a substrate, and includes forming the gate electrode; forming the gate insulation film on the gate electrode; forming the semiconductor layer including amorphous oxide on the gate insulation film; patterning the gate insulation film; patterning the oxide semiconductor; reducing the oxide semiconductor layer in resistance by forming the first insulation film on the oxide semiconductor layer in the atmosphere not including oxidized gas; patterning the first insulation film and allowing the channel region of the oxide semiconductor layer to be exposed; a processing of increasing the channel region in resistance by forming a second insulation film on the channel region and the first insulation film in the atmosphere including an oxidized gas; forming contact holes between the source electrode and the drain electrode and the region reduced in resistance of the oxide semiconductor layer below the first insulation film in the stacked first and second insulation films; forming a source electrode layer and a drain electrode layer in the region reduced in resistance of the oxide semiconductor layer through the contact holes; and patterning the source electrode and the drain electrode on the substrate.

Further, the present invention is a manufacturing method of a thin film transistor including at least a gate electrode, an oxide semiconductor layer, a first insulation film, a source electrode, a drain electrode, and a second insulation film on a substrate, and includes forming a semiconductor layer including amorphous oxide; patterning the oxide semiconductor layer; reducing the oxide semiconductor layer in resistance by forming a first insulation film on the oxide semiconductor layer in the atmosphere not including a oxidized gas; patterning the first insulation film and forming contact holes between the source electrode and the drain electrode and the oxide semiconductor layer; forming a source electrode layer and a drain electrode layer on the oxide semiconductor layer through the contact holes; forming the source electrode and the drain electrode by the patterning and allowing the first insulation film to be exposed; patterning the exposed first insulation film and allowing the channel region of the oxide semiconductor layer to be exposed; increasing the channel region in resistance by forming the second insulation film on the surface including the channel region of the oxide semiconductor layer in the atmosphere including the oxidized gas; and forming a gate electrode on the second insulation film on the substrate.

Further, the present invention is a manufacturing method of a thin film transistor including at least a gate electrode, an oxide semiconductor layer, a first insulation film, a source electrode, a drain electrode and a second insulation film on a substrate, and includes forming a semiconductor layer including amorphous oxide; patterning the oxide semiconductor layer; reducing the oxide semiconductor layer in resistance by forming the first insulation film on the oxide semiconductor layer in the atmosphere not including an oxidized gas; patterning the first insulation film and allowing a channel region of the oxide semiconductor layer to be exposed; increasing the channel region in resistance by forming a second insulation film on a surface including the channel region of the oxide semiconductor layer in the atmosphere including an oxidized gas; forming contact holes between the source electrode and the drain electrode and the region reduced in resistance of the oxide semiconductor layer below the first insulation film in the stacked first and second insulation film; forming a source electrode layer, a drain electrode layer and a gate electrode layer in the oxide semiconductor layer through the contact holes; and forming the source electrode, the drain electrode, and the gate electrode by the patterning on the substrate.

By following the present invention, it is possible to provide a thin film transistor having excellent transistor characteristics in ohmic contact for connecting the source electrode and the drain electrode by reducing a contact region with the electrode of an oxide semiconductor layer in resistance.

Further features of the present invention will become apparent from the following description of exemplary embodiments with reference to the attached drawings.

BRIEF DESCRIPTION OF THE DRAWING

FIGS. 17A, 17B, 17C, 17D, 17E, 17F, 17G, 17H and 17I are sectional views of the element for each manufacturing process of the top gate type thin film transistor element in which the contact region with the oxide semiconductor layer and the electrode is reduced in resistance.

BEST MODES FOR CARRYING OUT THE INVENTION

A thin film transistor of the present invention will be described below in detail with reference to the drawings. Unless specific notice is given in the present specification, every oxide semiconductor layer indicates an oxide semiconductor layer by amorphous oxide.

In the thin film transistor of the present embodiment, amorphous $SiO_x$ is used as a gate insulation film material. It is also possible to form an $Al_2O_3$ channel and a-$SiO_xN_y$ of an amorphous oxide insulator by a sputtering method.

As a channel layer of the thin film transistor, ZnO and the oxide semiconductor including In, Zn, and O are preferably used. As the channel layer, amorphous oxide including at least one kind from among Ga, Al, Fe, Sn, Mg, Ca, Si, and Ge in addition to In, Zn, and O is preferably used. Its conductivity is preferably $10^{-3}$ S/cm or more and $10^{-7}$ S/cm or less.

Figure 1:
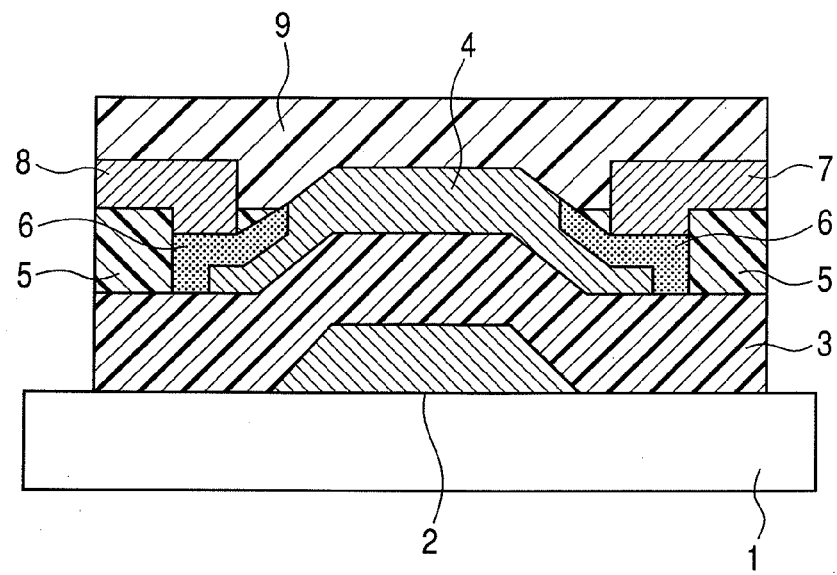
FIG. 1 is a structural drawing of an inversely staggered type thin film transistor in which a contact region with an oxide semiconductor layer and an electrode is reduced in resistance.

As a first example of the thin film transistor according to the present embodiment, a configuration of the thin film transistor of a bottom gate structure is shown in FIG. 1, in which the contact region with the oxide semiconductor layer and an electrode is reduced in resistance and the contact region is connected with a source electrode and a drain electrode. This is configured by providing on a gate electrode 2 on a substrate 1, and further, a gate insulation film 3, an oxide semiconductor layer 4 upon thereof, a first insulation film 5, a contact region 6 with the oxide semiconductor layer 4 and the electrode, a source electrode 7, a drain electrode 8, and a second insulation film 9.

FIGS. 14A to 14J show a sectional view of the element in each manufacturing process of the thin film transistor in the first example. Hereinafter, the manufacturing process of the element will be described by using FIGS. 14A to 14J.

Figure 14A:
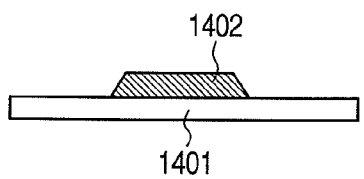
FIGS. 14A, 14B, 14C, 14D, 14E, 14F, 14G, 14H, 14I and 14J are sectional views of the element for each manufacturing process of the inversely staggered type thin film transistor element in which the contact region with the oxide semiconductor layer and the electrode is reduced in resistance.
Figure 14B:
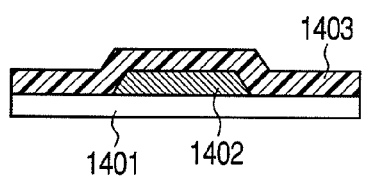
Figure 14C:
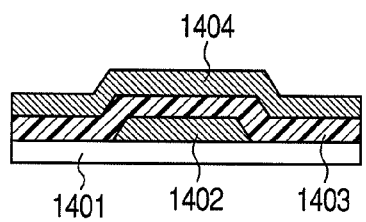

FIG. 14A shows a process of forming a gate electrode 1402 in a substrate 1401, and FIG. 14B shows a process of forming a gate insulation film 1403 on the gate electrode 1402. FIG. 14C shows a process of forming an oxide semiconductor layer 1404 on the gate insulation film 1403. When amorphous oxide including In, Zn, and O is used as the oxide semiconductor layer 1404, since the layer can be fabricated at the room temperature, all the deposition processes of the insulation film can be also performed at the room temperature if sputtering method is used. Further, as the substrate, a plastic substrate, a plastic film, and the like can be also used.

Figure 14D:
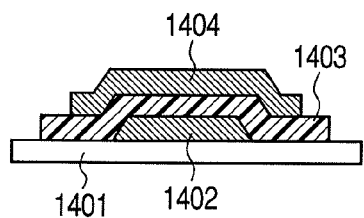
Figure 14E:
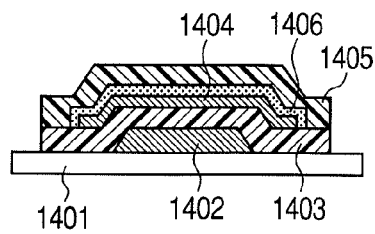

FIG. 14D shows a process of patterning the gate insulation film 1403 and the oxide semiconductor layer 1404. FIG. 14E shows a process of forming a first insulation film 1405 on the oxide semiconductor layer 1404. The first insulation film 1405 is an amorphous oxide insulator, and is formed in the atmosphere not including an oxidized gas, for example, in the atmosphere of an Ar gas 100%. From this, the oxide semiconductor layer receives damages, and, the generation of Oxygen deficiency of the oxide semiconductor with ZnO taken as a main component is expedited, and carrier electrons are numerously generated, so that the oxide semiconductor layer is reduced in resistance. As a result, a contact region 1406 with an electrode is formed in the oxide semiconductor layer 1404.

Figure 14F:
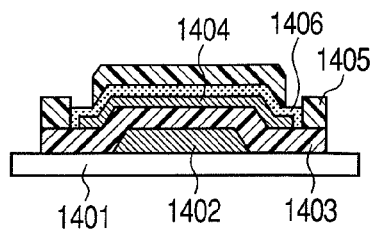
Figure 14G:
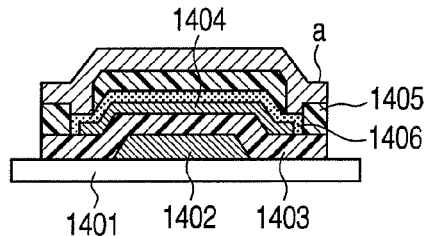
Figure 14H:
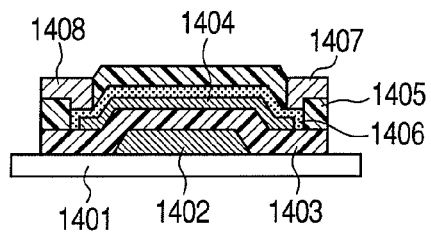

FIG. 14F shows a process of forming a contact hole with the electrode and the oxide semiconductor layer in the first insulation film 1405 by patterning. FIG. 14G shows a process of forming a source electrode layer and a drain electrode layer "a" by a transparent conductive oxide film such as ITO or IZO in the contact region 1406 with the oxide semiconductor layer and the electrode. FIG. 14H shows a process of forming a source electrode 1407 and a drain electrode 1408 by patterning, and at the same time, allowing the first insulation film 1405 to be exposed. As described earlier, since the oxide semiconductor layer 1404 is reduced in resistance, the contact region 1406 is of low-resistance, and an ohmic contact between the source electrode 1407, and the drain electrode 1408 and the oxide semiconductor layer becomes good. Here, for the patterning of the source electrode and the drain electrode, either method of dry etching or wet etching may be used. Further, as the source electrode and the drain electrode, a metal such as Ni, Cr, Rh, Mo, Nd, Ti, W, Ta, Pb, and Al and alloy including these metals or silicide may be used.

Figure 14I:
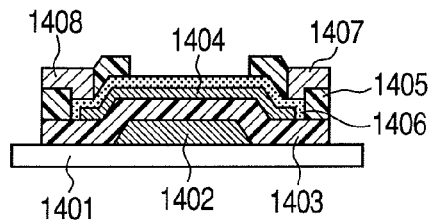

FIG. 14I shows a process of patterning the exposed first insulation film 1405 and allowing the channel region of the oxide semiconductor layer to be exposed.

Figure 14J:
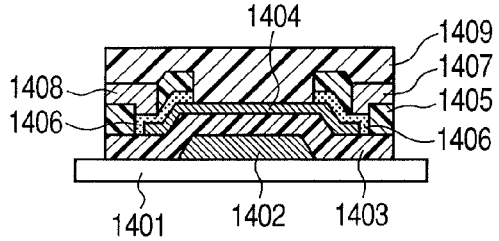

FIG. 14J shows a process of forming an amorphous oxide insulation layer which is a second insulation film 1409 of the present invention in the atmosphere including an oxidized gas in the channel region. By forming the second insulation film 1409 in the atmosphere of an oxidized gas, the ZnO-based oxide semiconductor layer is oxidized, and oxygen deficiency generating the carrier electrons can be reduced. As a result, the channel region can be increased in resistance to such an extent of being able to turn off the thin film transistor.

Figure 2:
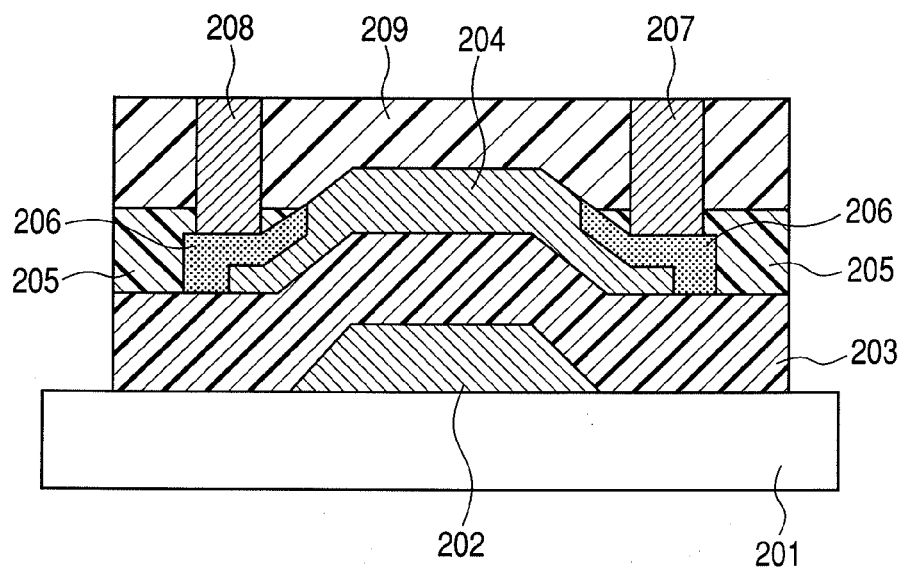
FIG. 2 is a structural drawing of another example of the inversely staggered type thin film transistor in which a contact region with an oxide semiconductor layer and an electrode is reduced in resistance.

Next, a second example of the thin film transistor according to the present embodiment will be shown in FIG. 2.

First, a gate electrode 202 is provided on a substrate 201. Further, a gate insulation film 203, an oxide semiconductor layer 204 upon thereof, a first insulation film 205, a contact region 206 with the oxide semiconductor layer and the electrode, a source electrode 207, a drain electrode 208, and a second insulation film 209 are provided, so that the thin film transistor is configured.

Figure 15A:
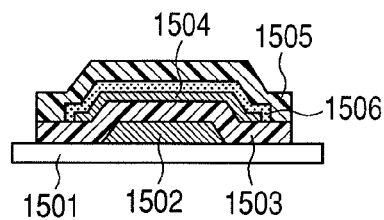
FIGS. 15A, 15B, 15C, 15D, 15E and 15F are sectional views of the element for each manufacturing process of another example of the inversely staggered type thin film transistor element in which the contact region with the oxide semiconductor layer and the electrode is reduced in resistance.

FIGS. 15A to 15F show a sectional view of the element for each manufacturing process of the thin film transistor in the second example. Hereinafter, the manufacturing process of the element will be described by using FIGS. 15A to 15F. A process of going through from forming and patterning a gate electrode 1502, a gate insulation film 1503, and an oxide semiconductor layer 1504 on a substrate 1501 up to a process of forming a first insulation film 1505 to form an contact region 1506 with the oxide semiconductor layer and the electrode are same as the first example. FIG. 15A shows a sectional view of the element after the processes have been completed.

Figure 15B:
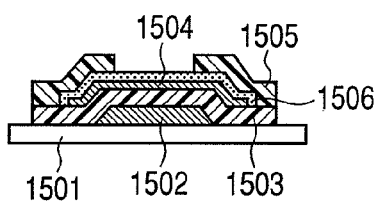

FIG. 15B shows a process of allowing the channel region of the oxide semiconductor layer to be exposed by patterning the first insulation film 1505.

Figure 15C:
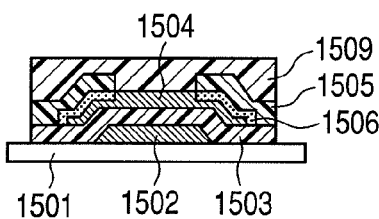

FIG. 15C shows a process of forming an amorphous oxide insulation film of the second insulation film 1509 on the channel region and the remaining first insulation film 1505 in the atmosphere including an oxidized gas similarly to the first example. As described earlier, the ZnO-based oxide semiconductor is oxidized, and at the time of forming the second insulation film 1509, the channel region of the oxide semiconductor layer 1504 is increased in resistance to such an extent of being able to turn off the thin film transistor.

Figure 15D:
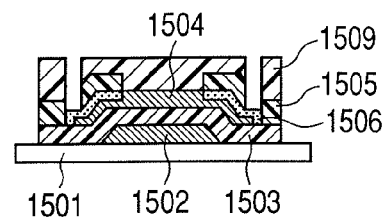

FIG. 15D shows a process of forming a contact hole with the oxide semiconductor layer and the electrode present at the bottom of the stacked first insulation film 1505 and second insulation film 1509.

Figure 15E:
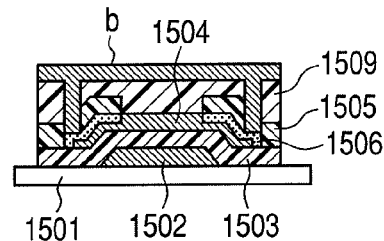

FIG. 15E shows a process of forming a source electrode layer and a drain electrode layer "b" in the contact region 1506 with the oxide semiconductor layer and the electrode by the transparent conductive oxide film such as ITO or IZO.

Figure 15F:
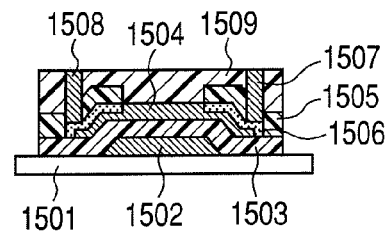

FIG. 15F shows a process of forming the source electrode and the drain electrode by patterning. Here, since a contact region 1506 is reduced in resistance at the time of forming the first insulation film, an ohmic contact between the source electrode 1507 as well as the drain electrode 1508 and the oxide semiconductor layer becomes good. Similarly to the first example, the patterning of the source electrode and the drain electrode may use either method of the dry etching or the wet etching. For the source electrode and the drain electrode also, similarly to the first example, a metal such as Ni, Cr, Rh, Mo, Nd, Ti, W, Ta, Pb, and Al and alloy including these metals or silicide may be used.

Figure 16:
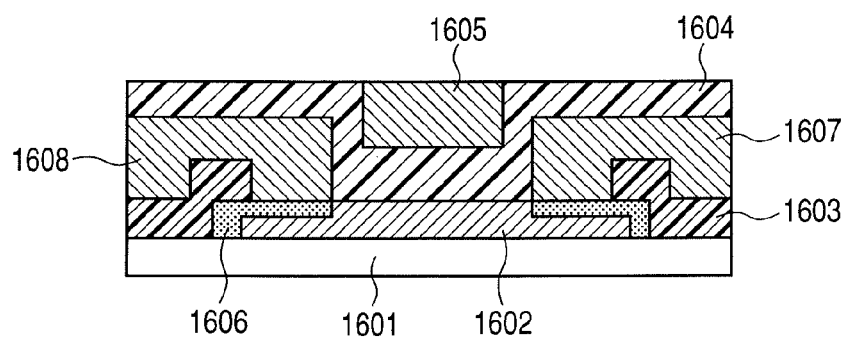
FIG. 16 is a structural drawing of the top gate type thin film transistor in which the contact region with the oxide semiconductor layer and the electrode is reduced in resistance.

Next, a third example of the thin film transistor according to the present embodiment will be shown in FIG. 16.

First, an oxide semiconductor layer 1602 is provided on a substrate 1601, and upon thereof, a first insulation film 1603 and a second insulation film 1604 are provided. Further, by providing a contact region 1606 with a gate electrode 1605, the oxide semiconductor layer, and the electrode, a source electrode 1607, and a drain electrode 1608 on the second insulation film, the thin film transistor is configured.

FIGS. 17A to 17I show a sectional view of the element for each manufacturing process of the thin film transistor in the third example. Hereinafter, the manufacturing process of the element will be described by using FIGS. 17A to 17I.

FIG. 17A shows a process of forming an oxide semiconductor layer on a substrate 1701. When amorphous oxide including In, Zn, and O is used as the oxide semiconductor layer 1702, since the layer can be fabricated at the room temperature, all the deposition processes of the insulation film can be performed at the room temperature if sputtering method is used. Further, as the substrate, a plastic substrate, a plastic film and the like can be also used.

FIG. 17B shows a process of patterning the oxide semiconductor layer 1702, FIG. 17C shows a process of forming a first insulation film 1703 on the oxide semiconductor layer 1702. The first insulation film 1703 is an amorphous oxide insulator, and is formed, similarly to the first and second examples, in the atmosphere not including an oxidized gas, for example, in the atmosphere of an Ar gas 100%. From this, the oxide semiconductor layer receives damages, and carrier electrons are numerously generated, and the oxide semiconductor layer is similarly reduced in resistance. As a result, a contact region 1706 with an electrode is formed in the oxide semiconductor layer 1702.

FIG. 17D shows a process of forming a contact hole with the electrode and the oxide semiconductor layer in the first insulation film 1703 by patterning. FIG. 17E shows a process of forming a source electrode layer and a drain electrode layer "C" by a transparent conductive oxide film such as ITO or IZO in the contact region 1706 with the oxide semiconductor layer and the electrode. FIG. 17F shows a process of forming a source electrode 1707 and a drain electrode 1708 by patterning, and at the same time, allowing the first insulation film 1703 to be exposed. As described earlier, since the oxide semiconductor layer 1702 is reduced in resistance, the contact region 1706 is of low-resistance, and an ohmic contact between the source electrode 1707, and the drain electrode 1708 and the oxide semiconductor layer becomes good. Here, for the patterning of the source electrode and the drain electrode, either method of dry etching or wet etching may be used. Further, as the source electrode and the drain electrode, a metal such as Ni, Cr, Rh, Mo, Nd, Ti, W, Ta, Pb, and Al and alloy including these metals or silicide may be used.

FIG. 17G shows a process of patterning the exposed first insulation film 1703 and allowing the channel region of the oxide semiconductor layer to be exposed.

FIG. 17H shows a process of forming an amorphous oxide insulation layer which is a second insulation film 1704 of the present invention in the atmosphere including an oxidized gas in the channel region. By forming the second insulation film 1704 in the atmosphere of the oxidized gas, the ZnO-based oxide semiconductor layer is oxidized, and oxygen deficiency generating carrier electrons can be reduced. As a result, the channel region can be increased in resistance to such an extent of being able to turn off the thin film transistor.

FIG. 17I shows a process of forming the gate electrode by patterning after the gate electrode layer is formed on the second insulation film 1704.

Figure 18:
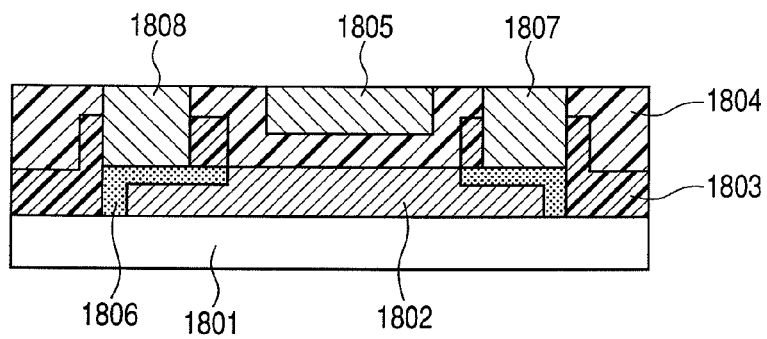
FIG. 18 is a structural drawing of another example of the top gate type thin film transistor in which the contact region with the oxide semiconductor layer and the electrode is reduced in resistance.

Next, a fourth example of the thin film transistor according to the present embodiment will be shown in FIG. 18.

First, an oxide semiconductor layer 1802 is provided on a substrate 1801, and upon thereof, a first insulation film 1803 and a second insulation film 1804 are provided. Further, by providing a contact region 1806 with a gate electrode 1805, the oxide semiconductor layer, and the electrode, a source electrode 1807, and a drain electrode 1808 on the second insulation film, the thin film transistor is configured.

FIGS. 19A to 19F show a sectional view of the element for each manufacturing process of the thin film transistor in the fourth example. Hereinafter, the manufacturing process of the element will be described by using FIGS. 19A to 19F.

Figure 19A:
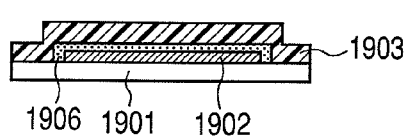
FIGS. 19A, 19B, 19C, 19D, 19E and 19F are sectional views of the element for each manufacturing process of another example of the top gate type thin film transistor element in which the contact region with the oxide semiconductor layer and the electrode is reduced in resistance.

Here, a process of going through from forming an oxide semiconductor layer 1902 on a substrate 1901 and forming a first insulation film 1903 upon thereof up to a process of forming a contact region 1906 with the oxide semiconductor layer and the electrode are the same as the third example. FIG. 19A shows a sectional view of the element after the process has been completed.

Figure 19D:
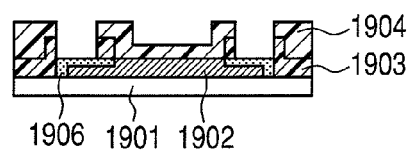
Figure 19B:
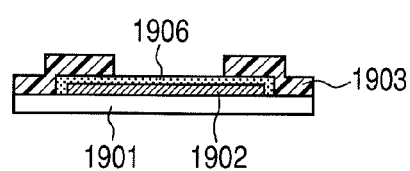

FIG. 19B shows a process of allowing the channel region of the oxide semiconductor layer to be exposed by patterning the first insulation film 1903.

Figure 19E:
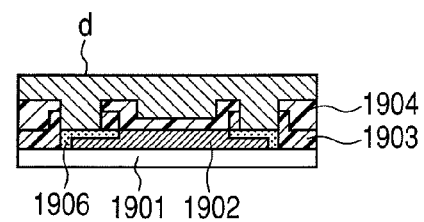
Figure 19C:
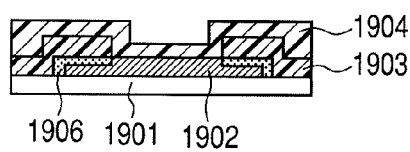

FIG. 19C shows a process of forming an amorphous oxide insulation layer of a second insulation film 1904 in the atmosphere including an oxidized gas similarly to the first example on the channel region and the remaining first insulation film 1903. As described earlier, the ZnO-based oxide semiconductor layer is oxidized, and when the second insulation film 1904 is formed, the channel region of the oxide semiconductor layer 1902 is increased in resistance to such an extent of being able to turn off the thin film transistor.

FIG. 19D shows a process of forming a contact hole with the oxide semiconductor layer and the electrode present at the bottom of the stacked first insulation film 1903 and second insulation film 1904.

FIG. 19E shows a process of forming a source electrode layer, a drain electrode layer, and a gate electrode layer "d" in the contact region 1906 with the oxide semiconductor layer and the electrode by the transparent conductive oxide film such as ITO or IZO.

Figure 19F:
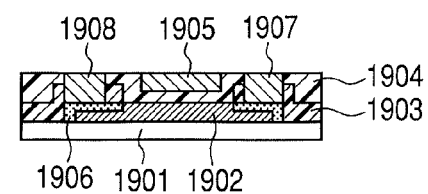

FIG. 19F shows a process of forming the source electrode, the drain electrode, and the gate electrode by patterning. Here, since a contact region 1906 is reduced in resistance at the time of forming the first insulation film, an ohmic contact between the source electrode 1907 as well as the drain electrode 1908 and the oxide semiconductor layer becomes good. Similarly to the first example, the patterning of the source electrode and the drain electrode may use either of the dry etching or the wet etching. For the source electrode and the drain electrode also, similarly to the first example, a metal such as Ni, Cr, Rh, Mo, Nd, Ti, W, Ta, Pb, and Al and alloy including these metals or silicide may be used.

As described above, from the first to fourth examples, in whichever mode, a good ohmic contact among the semiconductor oxide layer, the source electrode, and the drain can be obtained.

Next, as a comparison example, the thin film transistor in which the second insulation film is formed in the atmosphere not including an oxidized gas will be described.

Figure 3:
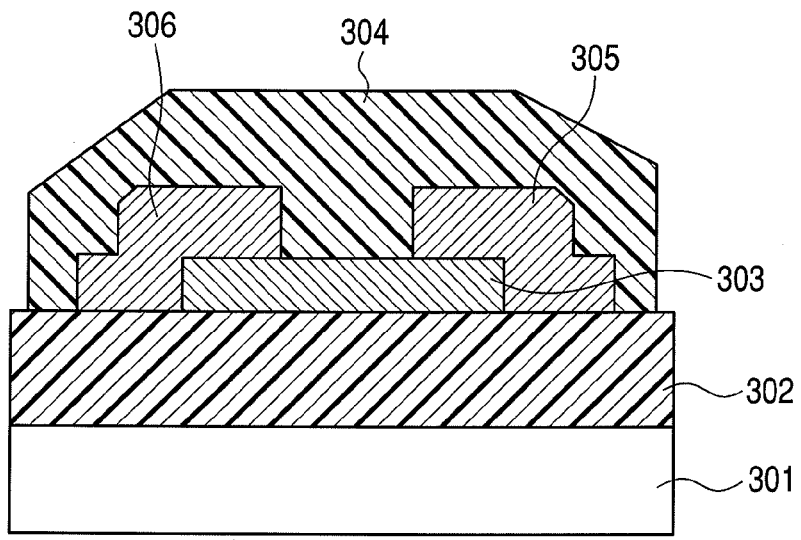
FIG. 3 is a structural drawing of the inversely staggered type thin film transistor using a thermally-oxidized film silicon gate insulation film on a low resistance n-type silicon substrate.

In FIG. 3 is shown a configuration of a bottom gate inversely staggered type thin film transistor using a thermally-oxidized silicon insulation film 302 with low resistance n-type crystal silicon as a gate electrode combined with substrate 301. First, how the forming condition of a second insulation film 304 affects the thin film transistor characteristic using the oxide semiconductor will be described by using the configuration of FIG. 3.

Figure 4:
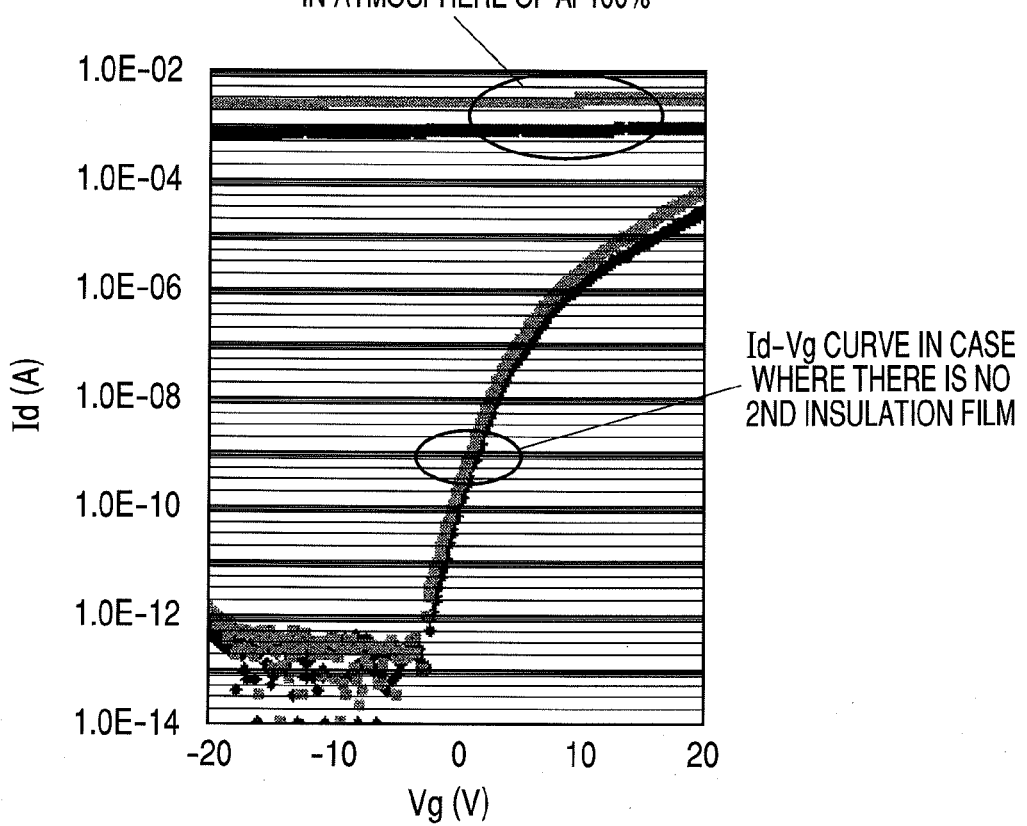
FIG. 4 is a view illustrating a typical current-voltage characteristic at the time of fabricating the inversely staggered type thin film transistor of FIG. 3.

As an oxide semiconductor layer 303, amorphous InGaZnO was formed. A source electrode 305 and a drain electrode 306 were evaporated in a laminated structure of Ti/Au/Ti, and were formed by a lift off method. When there is no second insulation film, here a thin film transistor: A was completed. After that, amorphous $SiO_x$ was formed 100 nm by using Ar 100% gas as the second insulation film by sputtering. On the source electrode 305 and the drain electrode 306, a contact hole was formed by the wet etching, so that a thin film transistor: B having a second insulation film was completed. In FIG. 4 is shown a typical current-voltage characteristic of the thin film transistor: A and the thin film transistor: B fabricated by the above described method. In the thin film transistor A, a thin film transistor characteristic good in an on-off ratio minimizing an off-state current was shown. On the other hand, in the thin film transistor B which forms amorphous $SiO_x$ considered as an ordinary oxidized film insulation layer as the second insulation film, an off-state current was not shown even at a gate voltage −20 V. As the cause, it is conceivable that the oxide semiconductor layer is reduced or oxygen deficiency is generated by the sputtering damages by the Ar gas at the time of forming the second insulation film. The ZnO-based oxide semiconductor tends to be entered with oxygen deficiency, and the carrier electrons tend to be numerously generated. Further, though FIG. 4 shows a result of using the sputtering method as the second insulation film forming method, when amorphous $SiO_x$ or amorphous $SiN_y$ is used by a P-CVD method as a second insulation film forming method, an On-Off ratio cannot be taken. Hence, in reality, the second insulation film ceased to operate as the thin film transistor. This is considered due to the fact that the oxide semiconductor is extremely sensitive for hydrogen, and a part contacting the second insulation film of the oxide semiconductor is extremely reduced in resistance.

Hereinafter, the effect of the second insulation film formed in the atmosphere including an oxidized gas, which is the feature of the present invention, will be described in detail below.

(On the Second Insulation Film)

Specifically, employment of the spattering method and formation of the amorphous oxide insulation layer by use of $O_2$/Ar mixed gas as a sputtering gas can realize an effect that the oxide semiconductor layer is not reduced or oxygen deficiency is not generated. This effect was recognized when the $O_2$/Ar mixed gas ratio is 10 volume % or more, and further, the ratio was preferably 50 volume %. In the following also, the mixed gas ratio of $O_2$/Ar is a volume percent. In 50% $O_2$/Ar mixed gas ratio, a good off-state current characteristic was obtained in almost all the oxide semiconductor conditions where a good off-state current characteristic is obtained in a case when a second insulation film 5 is not formed.

As a measurement method of the oxide content of amorphous $SiO_x$ which is the second insulation film, a temperature programmed desorption analysis method (TPD) is cited. A desorption peak of oxygen present in the thin film is observed within the temperature range of several tens ° C. to 400° C. in the temperatures measured by a thermo couple contacted on the substrate surface.

In the present invention, the oxygen desorbed from amorphous $SiO_x$ which is the second insulation film by the thermal desorption analysis has finished desorbing at approximately at 400° C. The measurement temperature range used for quantitative determination was taken from 50° C. to 80° C. by the temperature of the thermo couple contacted on the substrate surface.

Figure 5:
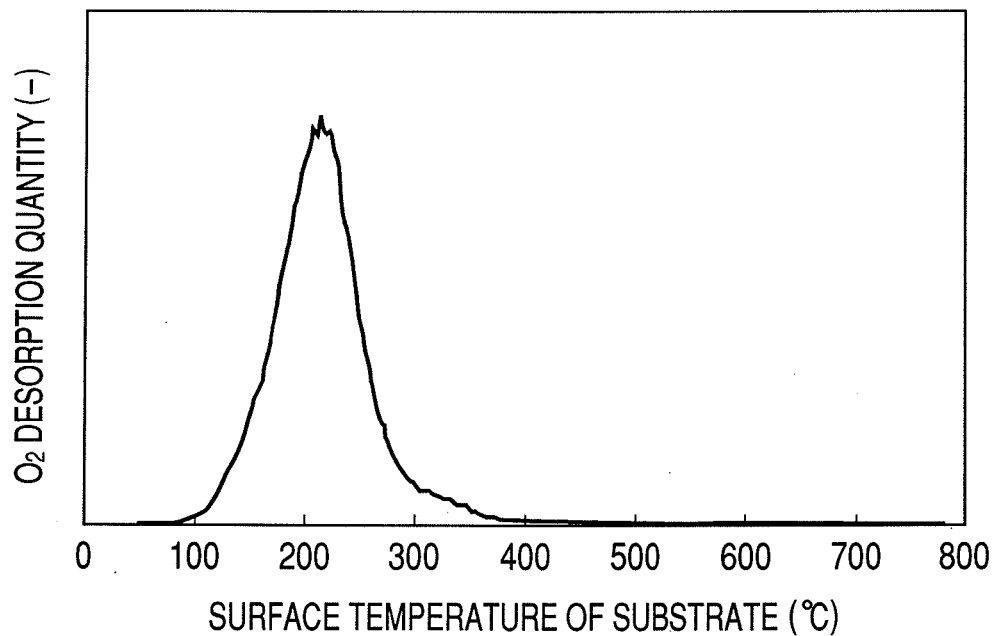
FIG. 5 is an example of oxygen desorption spectrum of a second insulation film measured by a temperature programmed desorption.
Figure 6:
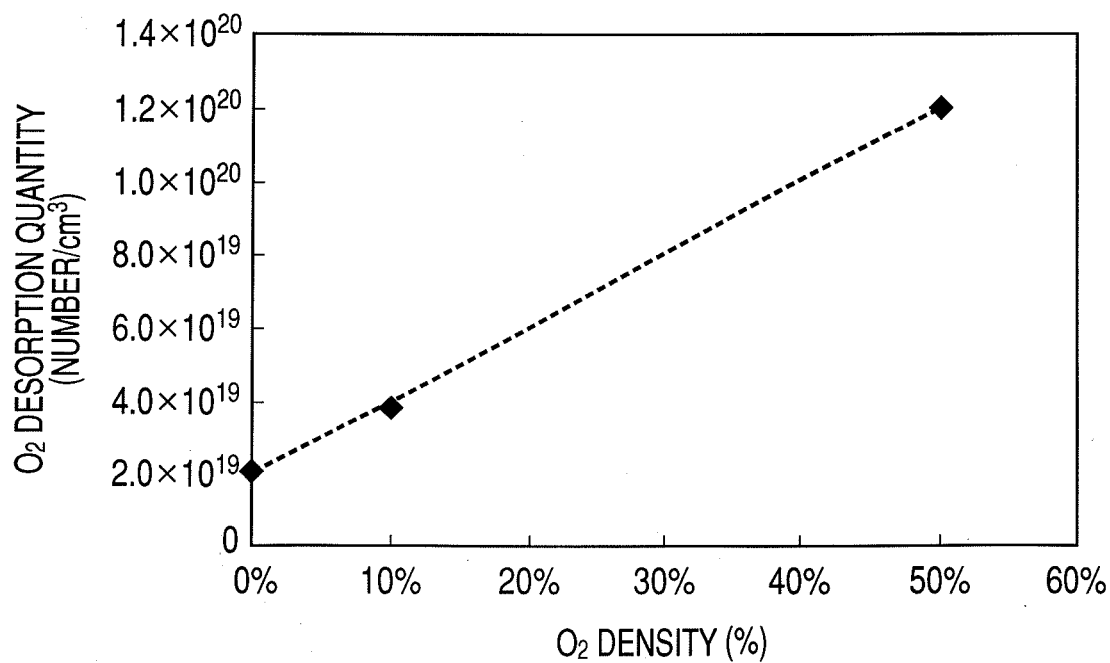
FIG. 6 is a view illustrating the relation between an oxygen desorption quantity from amorphous $SiO_x$ measured by the temperature programmed desorption and an $O_2$ gas density included in Ar which is a formative atmosphere.

That a kind of desorbed gas (also called desorption gas or desorption component) is oxygen was identified from ion strength of an atomic mass number (m/z) 32 equivalent to $O_2^+$ and an atomic mass number (m/z) 16 equivalent to $O^+$. Here, it should be noted that $O_2$ desorbed from a sample is ionized by a mass spectrometer and thus measured as $O_2^+$ and $O^+$, but the existent configurations and the chemical bonding states of measured $O_2^+$ and $O^+$ in the sample are not limited to $O_2^+$ and $O^+$. FIG. 5 shows an example of oxygen desorption spectrum measured by the temperature programmed desorption. An oxygen quantity desorbed from amorphous $SiO_x$ which is the second insulation film obtained in this manner was in a proportional relation with oxygen density in the formative atmosphere. FIG. 6 shows a relation between the oxygen desorption quantity from amorphous $SiO_x$ measured by the temperature programmed desorption and the $O_2$ gas included in Ar which is the formative atmosphere.

The present inventor and others have found the following as a result of the strenuous research and development conducted on the second insulation film of the thin film transistor using a transparent oxide semiconductor. When the $O_2$/Ar mixed gas is used as a sputtering deposition gas of amorphous $SiO_x$, and moreover, its mixed ratio is 10% or more, it is possible to suppress the generation of oxygen deficiency of the oxide semiconductor, and prevent the carrier electrons from being numerously generated, thereby to increase an off-state current.

It was found that amorphous $SiO_x$ having a suppression effect of the generation of this oxygen deficiency contains desorption gas, observed as $O_2^+$ and $O^+$ by temperature programmed desorption analysis, of $3.8 \times 10^{19}$ pcs/cm$^3$ or more in the film.

Further, the formation condition in which a process margin is wider and a stabilized characteristic is obtained is that a sputtering deposition gas $O_2$/Ar mixed ratio was 50%, and desorption gas, observed as $O_2^+$ and $O^+$ by temperature programmed desorption analysis, of $1.2 \times 10^{20}$ pcs/cm$^3$ or more is contained in the film.

According to the knowledge obtained by the present inventor and others, there is no upper limit imposed on the sputtering deposition gas $O_2$/Ar mixed ratio in the formation condition of amorphous $SiO_x$ which has the suppression effect of the generation of oxygen deficiency, and even in $O_2$ 100%, the effect can be obtained. However, by increasing the $O_2$/Ar mixed ratio, a deposition speed is reduced, and it is, therefore, most appropriate to use a sputtering deposition gas $O_2$/Ar mixed ratio to the extent of approximately 50% or less in view of productivity and cost. Although a relation between the sputtering deposition gas $O_2/Ar$ mixed ratio and the deposition speed depends on deposition parameters such as a deposition gas pressure and a distance between a substrate and a target, it is extremely sensitive to an oxygen partial pressure. Hence, usually, the formation condition of high oxygen partial pressure is hardly used. In the present formation condition, provided that the gas $O_2/Ar$ mixed ratio 0% is taken as a reference (100%), in the case of the gas $O_2/Ar$ mixed ratio of 10% and 50%, the deposition speed was 77% and 39%, respectively.

Figure 10:
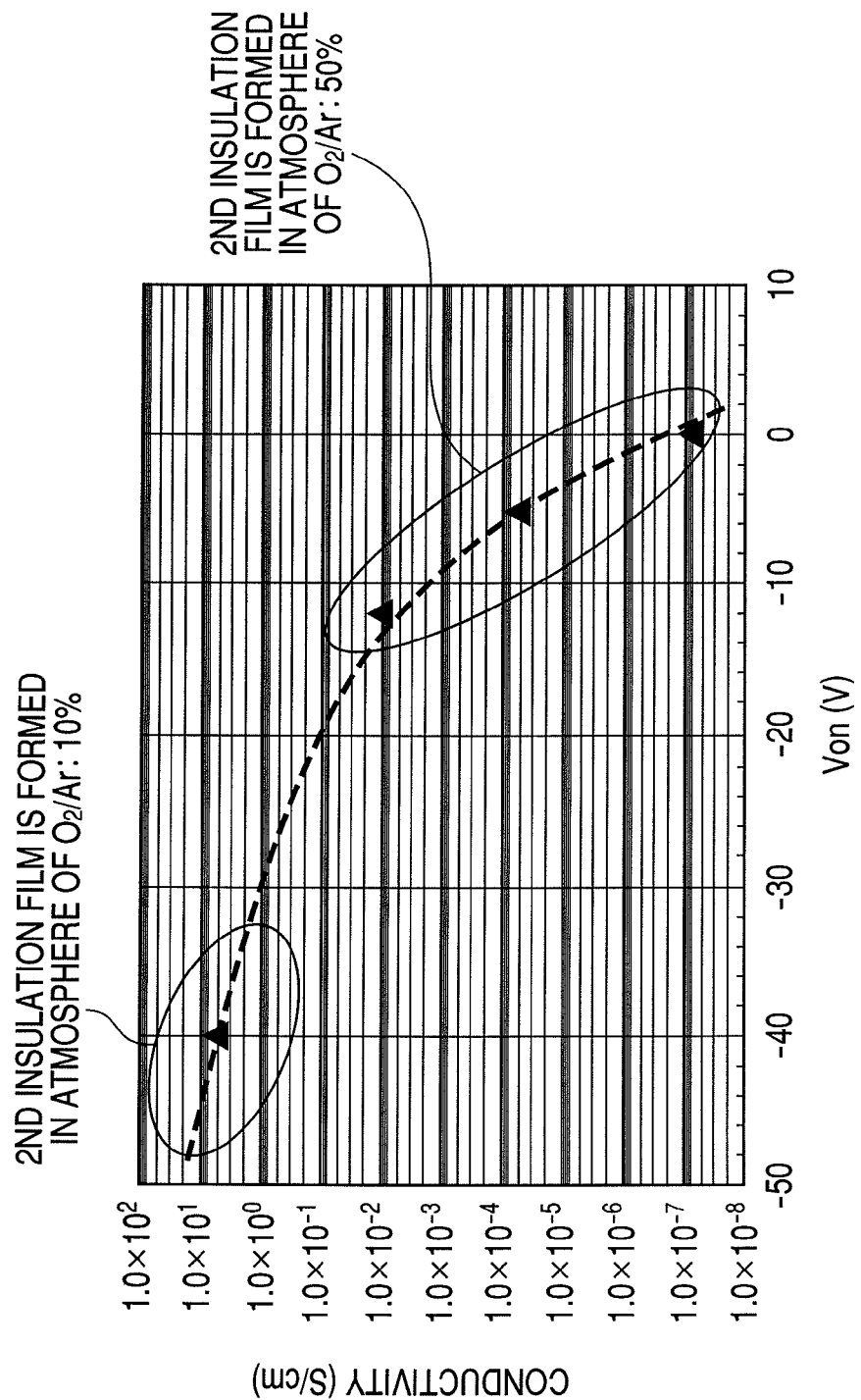
FIG. 10 is a view illustrating a relation between Von in the inversely staggered (bottom gate) type MISFET element and conductivity of the oxide semiconductor.
Figure 12:
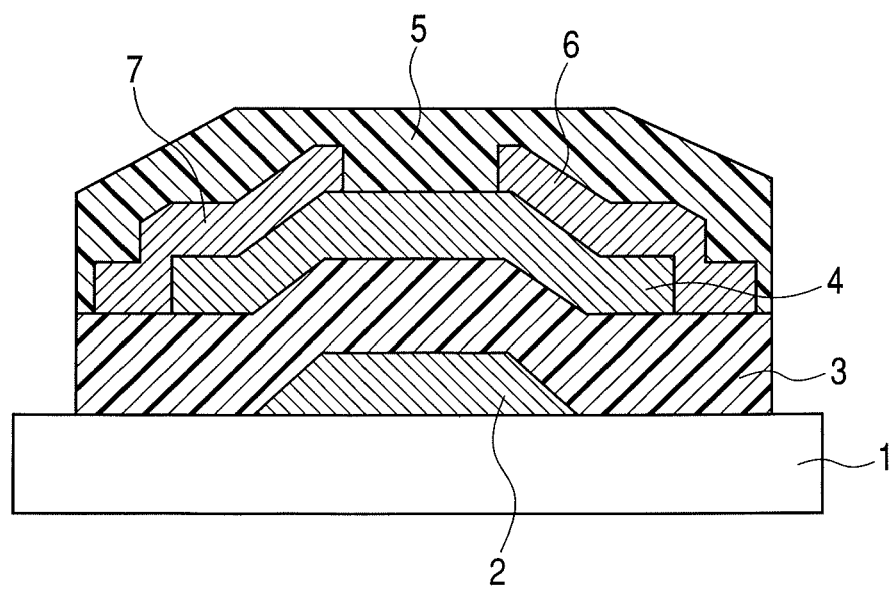
FIG. 12 is a structural drawing of the inversely staggered type thin film transistor having a protection film.

By using the above described amorphous $SiO_x$ as the second insulation film, a thin film transistor was fabricated, in which amorphous InGaZnO is formed on the same condition as the oxide semiconductor by the configuration of FIG. 12. At the same time, under the same process condition, an oxide semiconductor conductivity measurement TEG element was fabricated, thereby the conductivity of the oxide semiconductor layer was measured. In the transfer characteristic of thin film transistor, Von is a gate applied voltage at the rise time of the drain current (Id). A relation between the Von and the conductivity of the oxide semiconductor is shown in FIG. 10. A strong relation is found in the conductivity of the oxide semiconductor and the Von, and as the conductivity of the oxide semiconductor is increased, the Von is shifted to negative, and when the conductivity further increases, even below −40V, Von is not seen. As evident from this result, at the time of forming the second insulation film, the conductivity of the oxide semiconductor increases, so that the Von illustrating a boundary between an on-state current and an off-state current is shifted to negative, and is deteriorated. As a result, the off-state current characteristic is deteriorated. And, increase of the conductivity of the oxide semiconductor is suppressed depending on the condition of forming the second insulation film. Its suppression effect is recognized when the $O_2/Ar$ mixed gas ratio is 10% or more, and at that time, desorption gas, observed as $O_2^+$ and $O^+$ by temperature programmed desorption analysis, of $3.8 \times 10^{19}$ pcs/cm$^3$ or more is contained in the film.

Figure 11:
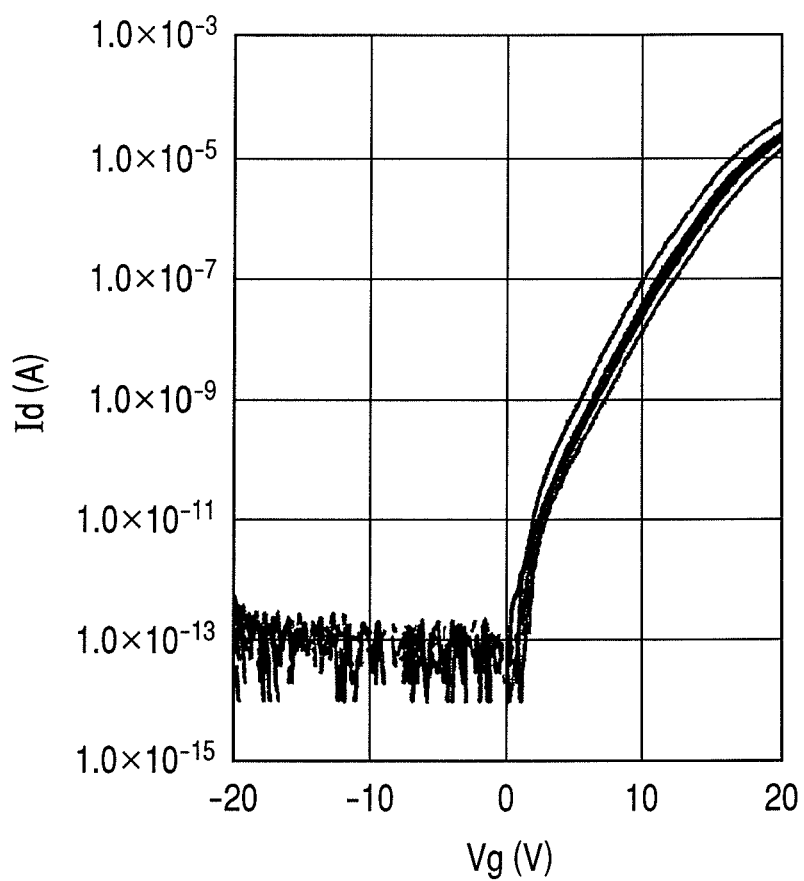
FIG. 11 is a graph illustrating transfer characteristics of the nine thin film transistors in a case when nine thin film transistors of the configuration of FIG. 3 are fabricated and the thin film transistor characteristics are measured.

As the second insulation film, with the sputtering deposition gas $O_2/Ar$ mixed ratio 50%, amorphous $SiO_x$ containing desorption gas, observed as $O_2^+$ and $O^+$ by temperature programmed desorption analysis, of $1.2 \times 10^{20}$ pcs/cm$^3$ or more in the film was used, and nine pieces of the thin film transistors having the configuration of FIG. 3 were fabricated, and the thin film transistor characteristic was measured. In FIG. 11 is shown the transfer characteristic of the nine pieces of the thin film transistors. The Von was controlled to approximately 0V, and the thin film transistor illustrating a good on-off ratio was obtained.

In the above explanation, while a case where the second insulation film is amorphous $SiO_x$ was described, the amorphous oxide insulator as the second insulation film can also use amorphous oxynitride and amorphous aluminum. Further, though a description was made by an example using the $O_2/Ar$ mixed gas as the oxidized gas at the time of forming the second insulation film, formation of the second insulation film not to increase the conductivity of the oxide semiconductor is the essence of the present invention. Consequently, the oxidized gas is not limited to oxygen.

For example, as the thin film transistor, an amorphous oxide semiconductor layer (a-IGZO thin film) whose composition ratio of indium, gallium, and zinc is 1:1:1 is formed by using the sputtering method capable of depositing a large area. This amorphous oxide semiconductor layer is applied to the thin film transistor so as to be made into the configuration of FIG. 1. By so doing, the on/off ratio of the transistor can be made $10^5$ or more. The electric field-effect mobility at that time shows 1 cm$^2$V$^{-1}$s$^{-1}$ or more.

By the effect as described above, in the bottom gate type thin film transistor using the oxide semiconductor, a channel region cable of stably minimizing the off-state current is formed, and moreover, the thin film transistor in which the contact region with the oxide semiconductor layer and the electrode is reduced in resistance can be obtained. Consequently, the thin film transistor whose ohmic contact between the source electrode and the drain electrode, and the oxide semiconductor layer is good can be obtained. Further, the thin film transistor having a good transistor characteristic minimizing the off-state current can be provided.

In the above description, an example using the transparent conductive oxide semiconductor amorphous thin film using ZnO as a main component as a semiconductor layer (channel layer) was described. Further, an example using amorphous oxide formed by including In—Ga—Zn—O was described, but the oxide semiconductor layer is not limited to these elements.

As the amorphous oxide semiconductor layer formed by including In—Ga—Zn—O, amorphous oxide formed by including at least one kind of Sn, In, and Zn can be used.

Further, when Sn is selected for at least a part of the component element of amorphous oxide, Sn can be substituted with $Sn_{1-x}M4_x$ ($0<x<1$, M4 is selected from Si, Ge or Zr of a group IV element which is smaller in atomic number than Sn). Further, when In is selected for at least a part of the component element of amorphous oxide, In can be substituted with $In_{1-y}M3_y$ ($0<y<1$, M3 is selected from B, Al, Ga or Y of a group III element which is smaller in atomic number than In). Further, when Zn is selected for at least a part of the component element of amorphous oxide, Zn can be substituted with $Zn_{1-z}M2_z$ ($0<z<1$, M2 is selected from Mg or Ca of a group II element which is smaller in atomic number than Zn).

Specifically, the amorphous materials applicable to the present embodiment are Sn—In—Zn oxide, In—Zn—Ga—Mg oxide, In oxide, In—Sn oxide, In—Ga oxide, In—Zn oxide, Zn—Ga oxide, Sn—In—Zn oxide, and the like. Of course, the composition ratio of the component elements is not necessarily 1:1. Although there are the cases where Zn and Sn are hard to form amorphous independently, by allowing In to be included, an amorphous phase can be easily formed. For example, in the In—Zn based oxide, it is preferably composed such that approximately 20 atomic % or more of In is contained with respect to the ratio of atomic number except oxygen. In the Sn—In based oxide, it is preferably composed such that approximately 80 atomic % or more of In is contained with respect to the ratio of atomic number except oxygen. In the Sn—In—Zn based oxide, it is preferably composed such that approximately 15 atomic % or more of In is contained with respect to atomic number except oxygen.

Further, amorphous can be confirmed by the fact that a definite diffraction peak is not detected (that is, a halo pattern is observed) when a measurement target thin film is subjected to X-ray diffraction by a low-incident angle of an approximately 0.5 degrees. In the present embodiment, when the above described materials are used for a channel layer of a field-effect type transistor, this does not exclude the channel layer containing a component material of state of microcrystal.

Next, by connecting the drain which is an output terminal of the thin film transistor to the electrode of the display element such as an organic or inorganic electroluminescent (EL) element and a liquid crystal element, a display device can be configured. In the following, an example of a specific display device configuration will be described by using a sectional view of the display device.

Figure 7:
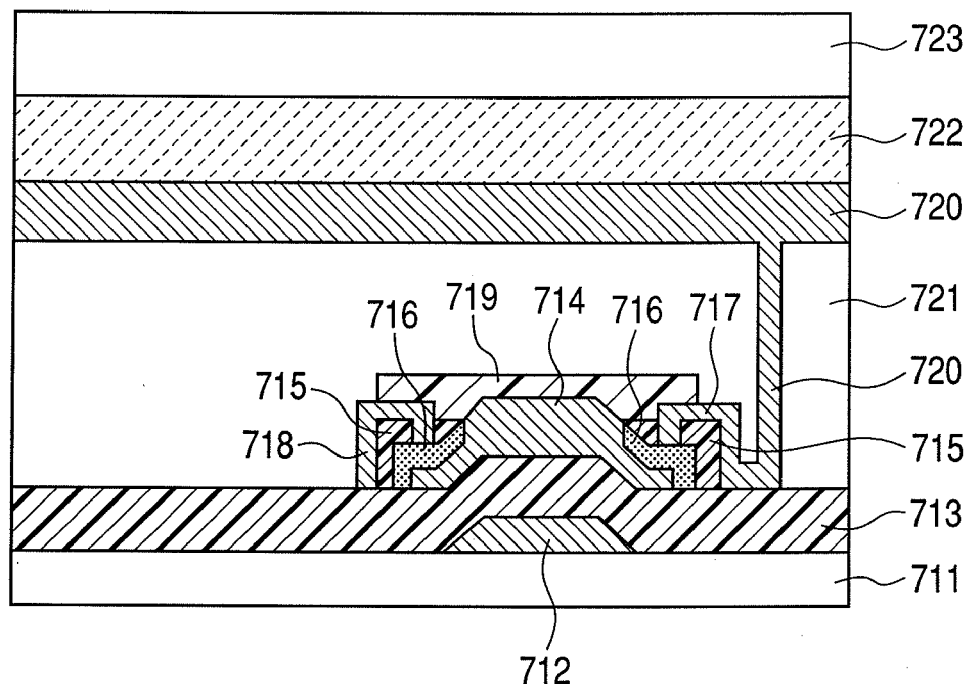
FIG. 7 is a sectional view of an example of a display device according to the present invention.

For example, a thin film transistor of the configuration as shown in FIG. 7 is formed. This has a configuration such that the following members are formed on a substrate 711. They include a gate electrode 712, a gate insulation layer 713, an oxide semiconductor layer 714, a first insulation film 715, a contact region 716 with the oxide semiconductor layer 714 and the electrode, a drain (source) electrode 717, a drain (source) electrode 718, and a second insulation film 719. The drain (source) electrode 718 is connected with an electrode 720 through an inter-layer insulation film 721, and the electrode 720 contacts an light emitting layer 722, and further, the light emitting layer 722 contacts an electrode 723. By this configuration, the current flowing into the light emitting layer 721 can be controlled by a current value flowing through a channel formed in the oxide semiconductor layer 714 from the source electrode (drain) 717 to the drain (source) electrode 718. Consequently, this current can be controlled by the voltage of the gate 712 of the thin film transistor. Here, an electrode 720, a light emitting layer 722, an electrode 723 configure an inorganic or an organic electroluminescent element. Here, while shown in FIG. 1 is a thin film transistor element, this may be a thin film.

Figure 8:
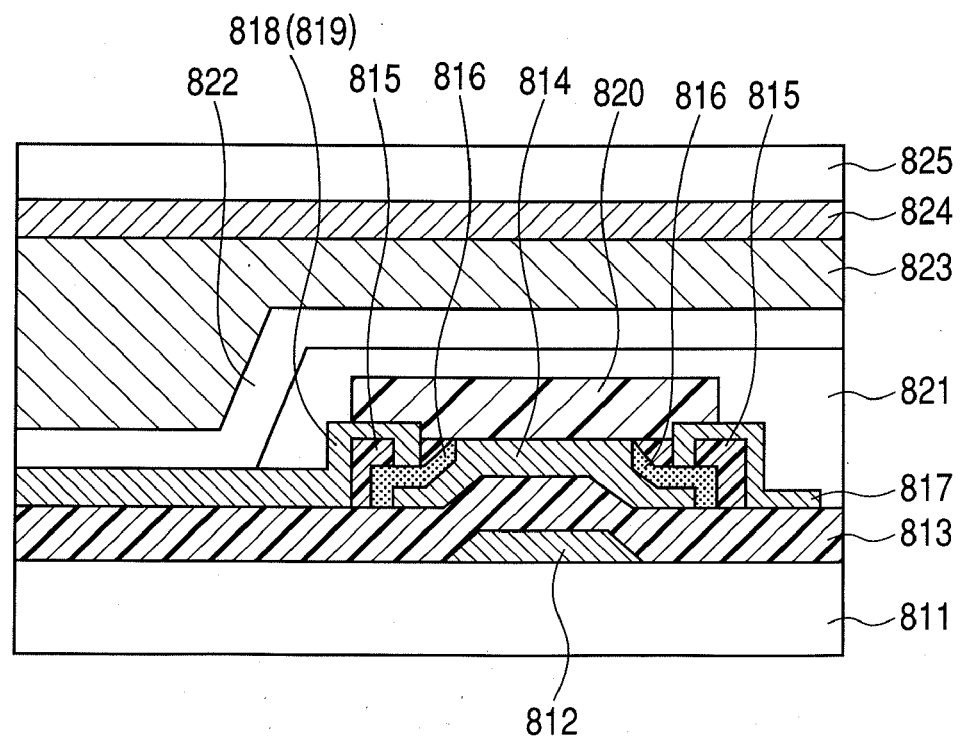
FIG. 8 is a sectional view of another example of the display device according to the present invention.

Alternatively, as shown in FIG. 8, a drain (source) electrode 818 is extended, and is configured to serve as an electrode 819, and this electrode can also adopt a configuration to become an electrode 825 to apply an voltage to a liquid crystal cell sandwiched by high resistance films 822 and 824 or an electrophoresis type particle cell 823. The liquid crystal cell, the electrophoresis type particle cell 823, the high resistance films 822 and 824, the electrode 819, and the electrode 825 configure a display element. Further, the first insulation film 815, the contact region 816 with the oxide semiconductor layer 814 and the electrode, and the second insulation film 820 are configured as shown in the figure. The voltage applied to these display elements can be controlled by a current value flowing, though a channel formed in the oxide semiconductor layer 814, from the source electrode 817 to the drain electrode 818. Accordingly, this can be controlled by an voltage of the thin film transfer gate 812. Here, if a display medium of the display element is a capsule sealing the liquid and the particle in the insulation membrane, the high resistance films 822 and 824 are not required. Here, while shown in FIG. 1 is a thin film transistor element, this may be a thin film.

In the above described two examples, though the thin film transistor has been represented by a bottom gate inversely staggered type configuration, the present invention is not necessarily limited to this configuration. For example, if a connection with the drain electrode which is an output terminal of the thin film transistor and the display element is topologically the same, another configuration such as a coplanar type may be possible.

Further, in the above described two examples, though an example has been shown in which a pair of electrodes driving the display element are provided in parallel with the substrate, the present embodiment is not necessarily limited to such a configuration. For example, if a connection with the drain electrode which is an output terminal of the thin film transistor and the display element is topologically the same, any of the electrodes or both electrodes may be provided vertically to the substrate.

Further, in the above described two examples, only one thin film transistor connected to the display element has been illustrated, the present invention is not necessarily limited to this configuration. For example, the thin film transistor shown in the figure may be further connected to another thin film transistor by the present invention, and the thin film transistor of the figure may be the final stage of the circuit by those thin film transistors.

Here, when a pair of the electrodes driving the display element is provided in parallel with the substrate, if the display element is an EL element or a reflection type display element such as a reflection type liquid crystal display element, any of the electrodes are required to be transparent for an emission wavelength or the wavelength of the reflection light. Alternatively, if the electrode is a transmission type display element such as a transmission type liquid crystal element, both of the electrodes are required to be transparent for a transmission light. Further, in the thin film transistor of the present embodiment, all the component elements can be also made transparent, and as a result, a transparent display element can be also formed. Further, such a display element can be provided even on a low-heat resistance substrate such as a light and flexible resin plastic substrate.

Next, a display device in which a plurality of pixels including an EL element (here an organic EL element) and the thin film transistor are two dimensionally disposed will be described by using FIG. 9.

Figure 9:
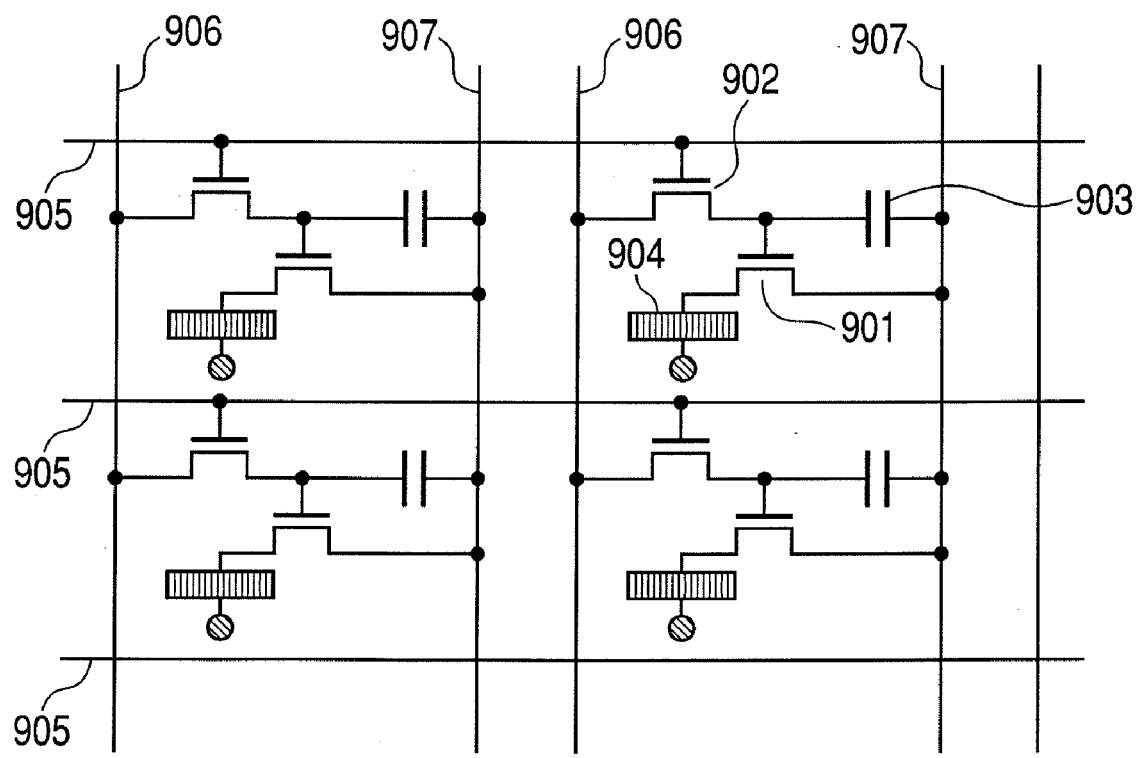
FIG. 9 is a view illustrating a configuration of the display device two-dimensionally disposed with a pixel including an organic EL element and a thin film transistor.

In FIG. 9, reference numeral 901 denotes a transistor for driving an organic EL layer 904, and reference numeral 902 denotes a transistor for selecting the pixel. Further, a capacitor 903 is for holding a selected state, and stores a charge between a common electrode wire 907 and a source portion of a transistor 902, and holds the signal of the gate of a transistor 901. Pixel selection is decided by a scanning electrode line 905 and a signal electrode line 906.

To describe more specifically, an image signal is applied to a gate electrode by way of a pulse signal from a driver circuit (not shown) through a scanning electrode line 905. At the same time, from another driver circuit (not shown) through a signal electrode line 906, the image signal is applied to the transistor 902 by way of the pulse signal so that the pixel is selected. At that time, the transistor 902 is turned on, and an electric charge is accumulated in the capacitor 903 present between the signal electrode line 906 and the source of the transistor 902. As a result, the gate voltage of the transistor 901 is held at a desired voltage, and the transistor 901 is on. This state is held until next signal is received. During a state in which the transistor 901 is on, the organic EL layer 904 is continued to be fed with the voltage and the current, thereby to maintain a light emission.

In this example of FIG. 9, though one pixel is made of two transistors and one capacitor, to improve the performance, many more transistors and the like can be incorporated. As described above, by using In—Ga—Zn—O based thin film transistor, which is a transparent thin film transistor of the present invention capable of being formed at a low temperature, in the transistor portion, an effective EL element can be obtained.

EXAMPLES

Hereinafter, the examples of the present invention will be described by using the drawings. However, the present invention is not limited to the following examples.

First Example

Figure 13:
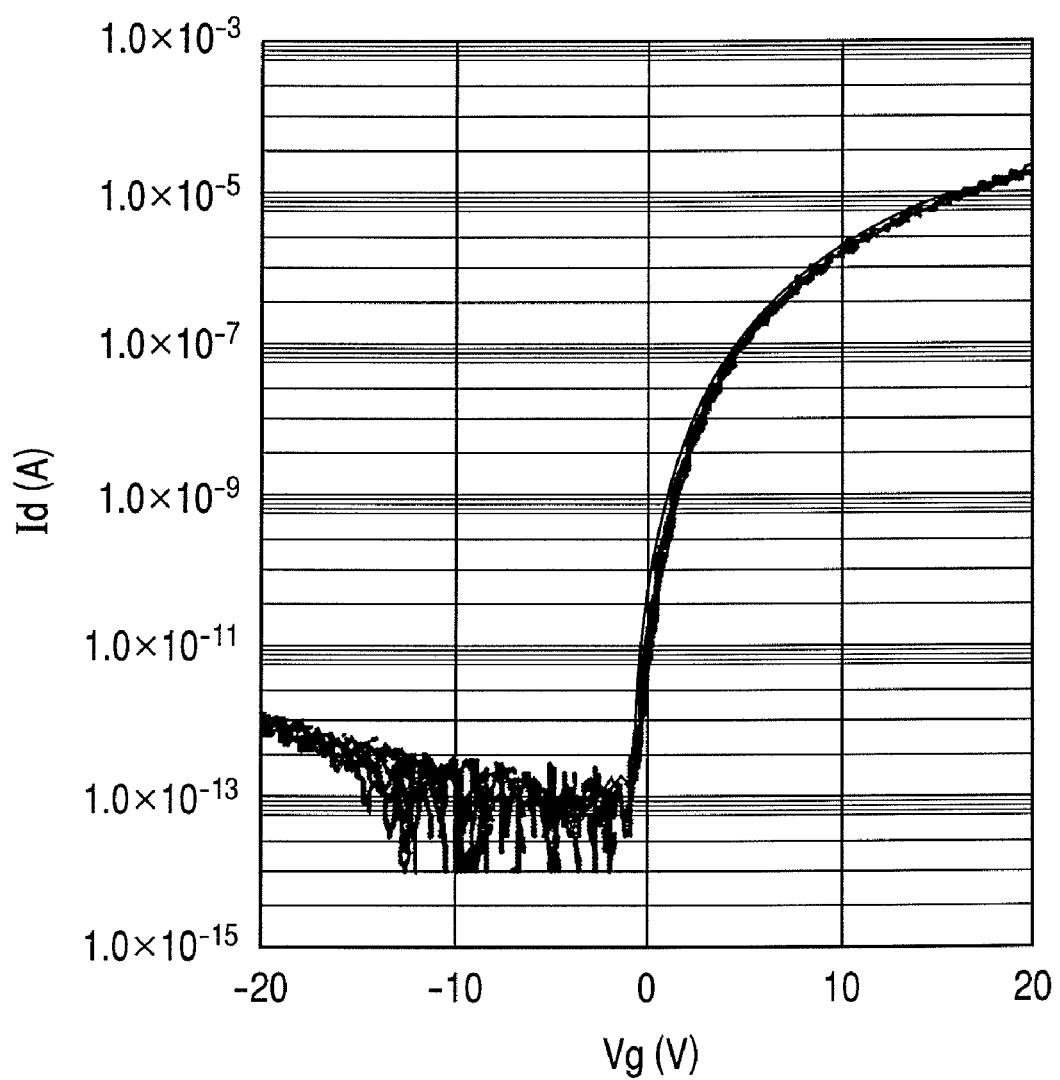
FIG. 13 is a graph illustrating transfer characteristics of the nine thin film transistors in a case when nine thin film transistors of the configuration of FIG. 11 are fabricated and the thin film transistor characteristics are measured.

In the present example an inversely staggered (bottom gate) type MISFET element was fabricated. First, by using a photolithography method and a lift-off method, a gate terminal of Ti 5 nm/Au 40 nm/Ti 5 nm was formed on a glass substrate. Further, on that gate terminal, an insulation layer of a-SiO$_x$ was formed in thickness of 200 nm by the sputtering method. At that time, a SiO$_2$ target was used for a sputtering target, and Ar gas was used for a sputtering gas. On the insulation layer, an amorphous oxide semiconductor film used as a semiconductor layer was formed in thickness of 20 nm at the room temperature by a sputtering method. The formation of the channel region employed the photolithography method and a wet etching by hydrochloric acid. After that, Ti 5 nm/Au 40 nm/Ti 5 nm was deposited by an electron beam vapor deposition method, and by the photolithography method and the lift-off method, source and drain terminals were formed. Further, as a second insulation film, a insulation layer was formed in thickness of 100 nm of a-SiO$_x$ by the sputtering method. At that time, as a sputtering gas, an oxide atmosphere of an O$_2$/Ar mixed gas ratio 50% was used. In this manner, nine inversely staggered (bottom gate) type MISFETs shown in FIG. 12 were fabricated. The metal composition ratio of the amorphous oxide semiconductor film at that time was In:Ga:Zn=1.00:0.94:0.65. When the I-V characteristic of this MISFET element was estimated, an average electric-field mobility was 5.0 cm$^2$/Vs, and average On-Off ratio was more than 10$^6$. In FIG. 13 is shown its transfer characteristic.

According to the present invention, in the oxide semiconductor bottom gate type thin film transistor using the second insulation film, the off-state current was minimized, and the thin film transistor having a good transistor characteristic was able to be stably fabricated.

Second Example

In the present example, an inversely staggered (bottom gate) type MISFET element was fabricated as similar to the first example except for the formation condition of a second insulation film.

As the second insulation film, an insulation layer by a-SiO$_x$ by a sputtering method was formed in the thickness of 100 nm. At that time, as a sputtering gas, an oxide atmosphere of an O$_2$/Ar mixed gas ratio 10% was used. In this manner, nine pieces of the inversely staggered (bottom gate) type MISFET elements shown in FIG. 12 were completed.

At the same time, under the same process condition, an oxide semiconductor conductivity measurement TEG element was fabricated, and the conductivity of the oxide semiconductor layer was measured. Von is a gate applied voltage at the rise time of a drain current (Id) in the transfer characteristic of a thin film transistor. A relation between the Von and the conductivity of the oxide semiconductor is shown in FIG. 10. Further, the second insulation film by a-SiO$_x$ using the O$_2$/Ar mixed gas ratio 10% as the sputtering gas contains desorption gas, which is observed as O$_2^+$ and O$^+$ by temperature programmed desorption analysis, of 3.8×10$^{19}$ pcs/cm$^3$ or more.

As a result, the second insulation film by a-SiO$_x$ using the O$_2$/Ar mixed gas ratio 10% had a suppression effect for the generation of oxygen deficiency of the oxide semiconductor, and showed Von: −40V as an average value, and an On/Off ration was more than 10$^6$, which was good.

Comparison Example 1

The presence comparison example is the same as the first example except for the formation condition of the second insulation film, and an inversely staggered (bottom gate) type MISFET element shown in FIG. 12 was fabricated.

As the second insulation film, the insulation film by a-SiO$_x$ by a sputtering method was formed in the thickness of 100 nm. At that time, as a sputtering gas, an oxide atmosphere of an O$_2$/Ar mixed gas ratio 1% or 0% was used. In this manner, nine pieces of the inversely staggered (bottom gate) type MISFET elements shown in FIG. 12 were completed.

As a result, in the case of the O$_2$/Ar mixed gas ratio 1% or 0%, the fluctuation of the characteristic was increased, and it was found that even when −50V is applied as a gate voltage, a definite Von was sometimes not seen, and for the oxide semiconductor, a definite suppression effect was not recognized for the generation of oxygen deficiency.

Third Example

In the present example, an inversely staggered (bottom gate) type MISFET element shown in FIG. 1 was fabricated. First, on a glass substrate, a gate electrode layer of a transparent conductive film IZO was formed in the thickness of 150 nm by using a sputtering method. By using a photolithography method and wet etching using hydrochloric acid, a gate electrode was formed. Further, on that electrode, an insulation layer by a-SiO$_x$ by a sputtering method was formed in the thickness of 200 nm. At that time, a SiO$_2$ target was used for a sputtering target, and an Ar gas was used for a sputtering gas. On that insulation layer, an amorphous oxide semiconductor film used as a semiconductor layer was formed in the thickness of 20 nm by the sputtering method at the room temperature. The formation of a channel region employed the photography method and the wet etching by hydrochloric acid. After that, as a first insulation film, the insulation layer by a-SiO$_x$ by the sputtering method was formed in the thickness of 100 nm. At that time, as the sputtering gas, the oxide atmosphere of the Ar gas 100% was used. By using the photolithography method and the dry etching by a CF$_4$ gas, a contact hole with the oxide semiconductor layer and the electrode was completed in the first insulation film. After that, through the contact hole, a transparent conductive film ITO was deposited in the thickness of 150 nm by the sputtering method, and after that, by the photolithography method and the etching method, source and drain terminals were formed, and at the same time, the first insulation film was exposed. By the photolithography method and the etching method, the first insulation film covering the channel region of the oxide semiconductor layer was removed, and after that, by the sputtering method, the insulation layer by a-SiO$_x$ was formed in the thickness of 100 nm. At that time, as the sputtering gas, the oxide atmosphere of an O$_2$/Ar mixed gas ratio 50% was used. In this manner, the inversely staggered (bottom gate) type transparent MISFET element shown in FIG. 1 was formed.

As a source electrode and a drain electrode, not only a transparent conductive oxide film such as IZO, but also a metal such as Ni, Cr, Rh, Mo, Nd, Ti, W, Ta, Pb, and Al, and an alloy including these metals or silicide can be used. Further, the source electrode and the drain electrode can be formed by different materials, respectively.

The inversely staggered (bottom gate) type MISFET element is formed with a channel region capable of stably minimizing an off-state current for the oxide semiconductor layer, and a contact region with the oxide semiconductor layer and the electrode is formed by being reduced in resistance. Hence, the off-state current is minimized, and this results in the thin film transistor good in an ohmic contact with the source electrode and the drain electrode as well as the oxide semiconductor layer.

Fourth Example

In the present example, an inversely staggered (bottom gate) type MISFET element shown in FIG. 2 was fabricated.

A process up to forming an insulation film by a-SiO$_x$ on an oxide semiconductor layer as a first insulation film is quite the same as the third example. Next, by using a photolithography method and dry etching by a CF$_4$ gas, a first insulation film covering a channel region of the oxide semiconductor layer was removed. After that, to cover the channel region of the oxide semiconductor layer, the insulation layer by a-SiO$_x$ by a sputtering method was formed in the thickness of 100 nm. At that time, as a sputtering gas, an oxide atmosphere of an O$_2$/Ar mixed gas ratio 50% was used. As a result, though the channel region of the oxide semiconductor layer is increased in resistance, other regions are kept reduced in resistance. Next, by using the photolithography method and dry etching by a CF$_4$ gas, the stacked first and second insulation films were completed with a contact hole with the region reduced in resistance of the oxide semiconductor layer and the electrode. After that, through the contact hole, a transparent conductive film ITO was deposited in the thickness of 150 nm by a sputtering method, and after that, by the photolithography method and an etching method, source and drain terminals were formed. In this manner, the inversely staggered (bottom gate) type transparent MISFET element shown in FIG. 2 was able to be formed.

As a source electrode and a drain electrode, not only a transparent conductive oxide film such as IZO, but also a metal such as Ni, Cr, Rh, Mo, Nd, Ti, W, Ta, Pb, and Al, and an alloy including these metals or silicide can be used similarly to the third embodiment. Further, similarly to the third example, the source electrode and the drain electrode can be formed by different materials, respectively.

Similarly to the third example, this inversely staggered (bottom gate) type transparent MISFET element is formed with a channel region capable of stably minimizing an off-state current for the oxide semiconductor layer, and a contact region with the oxide semiconductor layer and the electrode is formed by being reduced in resistance. Hence, the off-state current is minimized, and this results in the thin film transistor good in an ohmic contact with the source electrode and the drain electrode as well as the oxide semiconductor layer.

Fifth Example

In the present example, a display device using a thin film transistor of FIG. 8 will be described. The thin film transistor to be used was fabricated in the same fabrication process as the third example. In this thin film transistor, a short side of the island of ITO film as a drain electrode is extended up to 100 μm, and the extended portion of 90 μm is left behind, and with wiring toward the source electrode and the gate electrode kept, the thin film transistor was covered by the insulation layer. On that layer, a polyimide film was coated, and was subjected to a lapping process. On the other hand, the ITO film and the polyimide film formed similarly on the plastic substrate and subjected to the lapping process were prepared, and were faced to the substrate formed with the thin film transistor with an air gap of 5 μm provided, and a nematic liquid crystal was injected here. Further, a pair of polarized plates were provided on both sides of this structure. Here, when a voltage was applied to the source electrode of the thin film transistor and the applied voltage of the gate electrode was changed, a region only of 30 μm×90 μm, which is a part of the island of the ITO film extended from the drain electrode, was changed in light transmittance. Further, this light transmittance can be continuously changed even by the voltage between the source and the drain under the gate voltage in which the thin film transistor is put into an on-state. In this manner, the display device with the liquid crystal cell corresponding to FIG. 8 taken as a display element was fabricated. Further, even by using the thin film transistor by the fabrication process of the fourth example, quite the same display device can be fabricated.

In the present example, a configuration is also possible such that, as a substrate to form the thin film transistor, a white plastic substrate is used, and each electrode of the thin film transistor is replaced by gold, and the polyimide film and the polarized plate are eliminated. Also, the configuration is such that a capsule covered with the particle and the fluid by the insulation film is filled into the air space of the white and transparent plastic substrates. In the display device of this configuration, the voltage between the drain electrode extended by the present thin film transistor and the ITO film of the upper portion is controlled, whereby the particle inside the capsule moves up and down. Based on this, by controlling reflectance of the extended drain electrode region seen from the transparent substrate side, display can be performed.

Further, in the present example, a plurality of thin film transistors are formed adjacently, and for example, a current control circuit of an ordinary configuration made of four transistors and one capacitor is constructed, and one of the transistors of the final stage is taken as a thin film transistor of FIG. 6, so that an EL element can be also driven. For example, a thin film transistor taking the ITO film as a drain electrode is used. In the region of 30 μm×90 μm which is a part of the island of the ITO film extended from the drain electrode, an organic electroluminescent element made of a charge injection layer and an emission layer is formed. In this manner, the display device using the EL element can be formed.

Sixth Example

The display element and the thin film transistor of the third example were two-dimensionally disposed. First, a pixel that occupies an area of approximately 30 μm×115 μm including the display element such as the liquid crystal cell and the EL element of the fifth example and the thin film transistor was disposed in square of 7425×1790 pieces with 40 μm pitch in the short side and 120 μm pitch in the long side, respectively. Next, 1790 gate wirings penetrating the gate electrodes of 7425 thin film transistors in the long side direction, and 7425 signal lines where the source electrodes of 1790 thin film transistors penetrate a portion protruded 5 μm from the island of a non crystal oxide semiconductor film in the short side direction were provided. Each of them was connected to a gate driver circuit and a source driver circuit, respectively. Further, in the case of the liquid crystal display element, a position was adjusted by the same size as the liquid crystal display element, and a color filter with RGB repeated in the long side direction was provided on the surface, and an active matrix type color image display device of an A4 sheet size was constructed by an approximately 211 ppi. Needless to mention, this configuration is just an example, and can be replaced by another configuration. Further, even when the thin film transistor by the fabrication method of the fourth example is used, quite the same display device can be fabricated.

Further, from among two thin film transistors included in one EL element, the gate electrode of a first thin film transistor is wired on a gate line, and the source electrode of a second thin film transistor is wired on a signal line, and further, the emission wavelength of the EL element is repeated by RGB in the long side direction. By so doing, an emission type color image display device of the same resolution can be constructed.

Here, a driver circuit for driving the active matrix may be configured by using the same thin film transistor of the present invention as the thin film transistor of the pixel or the existing IC chip may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present application claims priority on the basis of Japanese Patent Application No. 2007-145186 filed on May 31, 2007, which is hereby incorporated by reference herein in its entirety.

The invention claimed is:

1. A manufacturing method of a thin film transistor having at least a gate electrode, a gate insulation film, an oxide semiconductor layer, a first insulation film, a source electrode, a drain electrode, and a second insulation film on a substrate, including:
   forming the gate electrode on the substrate;
   forming the gate insulation film on the gate electrode;
   forming a semiconductor layer including amorphous oxide on the gate insulation film;
   reducing the oxide semiconductor layer in resistance by forming the first insulation film on the oxide semiconductor layer in the atmosphere not including an oxidized gas;
   patterning the first insulation film to form contact holes;
   forming a source electrode layer in contact with the oxide semiconductor layer through one of the contact holes, and a drain electrode layer in contact with the oxide semiconductor layer through one of the contact holes;
   forming the source electrode and the drain electrode by patterning and allowing the first insulation film to be exposed;
   patterning the exposed first insulation film and allowing a channel region of the oxide semiconductor layer to be exposed; and
   increasing the channel region in resistance by forming the second insulation film on the surface including the channel region of the oxide semiconductor layer in the atmosphere including an oxidized gas.

2. A manufacturing method of a thin film transistor having at least a gate electrode, a gate insulation film, an oxide semiconductor layer, a first insulation film, a source electrode, a drain electrode, and a second insulation film on a substrate, including:
   forming the gate electrode on the substrate;
   forming the gate insulation film on the gate electrode;
   forming a semiconductor layer including amorphous oxide on the gate insulation film;
   reducing the oxide semiconductor layer in resistance by forming the first insulation film on the oxide semiconductor layer in the atmosphere not including an oxidized gas;
   patterning the first insulation film and allowing the channel region of the oxide semiconductor layer to be exposed;
   increasing the channel region in resistance by forming the second insulation film on the channel region and the first insulation film in the atmosphere including an oxidized gas;
   forming contact holes in the stacked first and second insulation films;
   forming a source electrode layer in contact with a region of reduced resistance of the oxide semiconductor layer through one of the contact holes, and a drain electrode layer in contact with a region of reduced resistance of the oxide semiconductor layer through one of the contact holes; and
   patterning the source electrode layer and the drain electrode layer.

3. A manufacturing method of a thin film transistor having at least a gate electrode, an oxide semiconductor layer, a first insulation film, a source electrode, a drain electrode, and a second insulation film on a substrate, including:
   forming a semiconductor layer including amorphous oxide on a substrate;
   patterning the oxide semiconductor layer;
   reducing the oxide semiconductor layer in resistance by forming the first insulation film on the oxide semiconductor layer in the atmosphere not including an oxidized gas;
   patterning the first insulation film to form contact holes;
   forming a source electrode layer and a drain electrode layer in contact with the oxide semiconductor layer through the contact holes;
   forming the source electrode and the drain electrode by patterning and allowing the first insulation film to be exposed;
   patterning the exposed first insulation film and allowing the channel region of the oxide semiconductor layer to be exposed;
   increasing the channel region in resistance by forming the second insulation film on a surface of the channel region of the oxide semiconductor layer in the atmosphere including an oxidized gas; and
   forming the gate electrode on the second insulation film.

4. A manufacturing method of a thin film transistor having at least a gate electrode, an oxide semiconductor layer, a first insulation film, a source electrode, a drain electrode, and a second insulation film on a substrate, including:
   forming a semiconductor layer including amorphous oxide on a substrate;
   patterning the oxide semiconductor layer;
   reducing the oxide semiconductor layer in resistance by forming the first insulation film on the oxide semiconductor layer in the atmosphere not including an oxidized gas;
   patterning the first insulation film and allowing the channel region of the oxide semiconductor layer to be exposed;
   increasing the channel region in resistance by forming the second insulation film on the surface of the channel region of the oxide semiconductor layer in the atmosphere including an oxidized gas;
   forming contact holes in the stacked first and second insulation films;
   forming a gate electrode layer, a source electrode layer in contact with a region of reduced resistance in oxide semiconductor layer though one of the contact holes, and a drain electrode layer in contact with a region of reduced resistance in the oxide semiconductor layer through the contact holes; and
   forming the source electrode, the drain electrode, and the gate electrode by patterning.

5. The manufacturing method of the thin film transistor according to claim 1, wherein, as the atmosphere including the oxidized gas, an $O_2$/Ar mixed gas is used, and oxygen is present in an amount of 10 volume % or more.

6. The manufacturing method of the thin film transistor according to claim 1, wherein the amorphous oxide is amorphous oxide including at least one of In, Zn, and Sn or amorphous oxide including In, Zn, and Ga.

7. The manufacturing method of the thin film transistor according to claim 1, wherein the first insulation film is an amorphous oxide insulator.

8. The manufacturing method of the thin film transistor according to claim 1, wherein the second insulation film is an amorphous oxide insulator, and contains desorption gas, observed as $O_2^+$ and $O^+$ by temperature programmed desorption analysis, of $3.8 \times 10^{19}$ pcs/cm$^3$ or more.

* * * * *